United States Patent
Roy et al.

(10) Patent No.: US 9,852,978 B2
(45) Date of Patent: Dec. 26, 2017

(54) METAL LAYOUT FOR RADIO-FREQUENCY SWITCHES

(71) Applicant: SKYWORKS SOLUTIONS, INC., Woburn, MA (US)

(72) Inventors: Ambarish Roy, Waltham, MA (US); Guillaume Alexandre Blin, Carlisle, MA (US); Yu Zhu, Wellesley, MA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 14/985,600

(22) Filed: Dec. 31, 2015

(65) Prior Publication Data

US 2016/0225709 A1    Aug. 4, 2016

Related U.S. Application Data

(62) Division of application No. 14/487,063, filed on Sep. 15, 2014.
(Continued)

(51) Int. Cl.
*H01L 23/50* (2006.01)
*H01L 29/417* (2006.01)
(Continued)

(52) U.S. Cl.
CPC .......... *H01L 23/50* (2013.01); *H01L 23/4825* (2013.01); *H01L 27/1203* (2013.01); *H01L 29/0696* (2013.01); *H01L 29/41758* (2013.01); *H01L 29/4238* (2013.01); *H01L 29/78* (2013.01); *H01L 29/778* (2013.01); *H01L 2224/48091* (2013.01); *H01L 2224/48227* (2013.01); *H01L 2924/15184* (2013.01); *H01L 2924/15192* (2013.01); *H01L 2924/181* (2013.01)

(58) Field of Classification Search
CPC .......... H01L 29/41758; H01L 29/0696; H01L 23/50
See application file for complete search history.

(56) References Cited

U.S. PATENT DOCUMENTS

| | | | | |
|---|---|---|---|---|
| 5,151,759 A | * | 9/1992 | Vinal | H01L 29/4916 257/348 |
| 2009/0278207 A1 | * | 11/2009 | Greenberg | H01L 23/4824 257/386 |

(Continued)

*Primary Examiner* — Tucker J Wright
(74) *Attorney, Agent, or Firm* — Chang & Hale LLP

(57) ABSTRACT

Metal layout for radio-frequency (RF) switches. In some embodiments, an RF switching device can include a plurality of field-effect transistors (FETs) arranged in series to form a stack. Each of at least some of the FETs can include a source contact and a drain contact, a first group of fingers electrically connected to the source contact, and a second group of fingers electrically connected to the drain contact and arranged in an interleaved configuration with the first group of fingers. At least some of the first group of fingers and the second group of fingers can include a first metal M1 and a second metal M2 arranged in a stack. At least one of the first metal M1 and the second metal M2 can include a tapered portion to yield a current carrying capacity that varies as a function of location along a direction in which the corresponding finger extends.

20 Claims, 18 Drawing Sheets

Related U.S. Application Data

(60) Provisional application No. 61/879,148, filed on Sep. 18, 2013.

(51) Int. Cl.
*H01L 29/06* (2006.01)
*H01L 29/78* (2006.01)
*H01L 29/423* (2006.01)
*H01L 23/482* (2006.01)
*H01L 27/12* (2006.01)
*H01L 29/778* (2006.01)

(56) References Cited

U.S. PATENT DOCUMENTS

2011/0170231 A1* 7/2011 Chandrasekaran ... H01L 23/552
 361/306.1
2012/0273849 A1* 11/2012 Adamski ............ H01L 23/4824
 257/288

* cited by examiner

METAL LAYOUT FOR RADIO-FREQUENCY SWITCHES

CROSS-REFERENCE TO RELATED APPLICATION(S)

This application is a divisional of U.S. application Ser. No. 14/487,063 filed Sep. 15, 2014, entitled DEVICES AND METHODS RELATED TO RADIO-FREQUENCY SWITCHES HAVING REDUCED-RESISTANCE METAL LAYOUT, which claims priority to and the benefit of the filing date of U.S. Provisional Application No. 61/879,148 filed Sep. 18, 2013, entitled DEVICES AND METHODS RELATED TO RADIO-FREQUENCY SWITCHES HAVING REDUCED-RESISTANCE METAL LAYOUT, the benefits of the filing dates of which are hereby claimed and the disclosures of which are hereby expressly incorporated by reference in their entirety.

BACKGROUND

Field

The present disclosure generally relates to radio-frequency switches having reduced-resistance metal layout.

Description of the Related Art

In antenna tuning or some other switching applications such as radio-frequency (RF) switches and passive components, a plurality of switching elements (e.g., field-effect transistors (FET)) can be used as passive components. They are commonly arranged in a stack configuration to facilitate appropriate handling of power. For example, a higher FET stack height can be utilized to allow an RF switch to withstand high power under mismatch.

SUMMARY

In some implementations, the present disclosure relates to a field-effect transistor (FET) device that includes a plurality of fingers arranged in an interleaved configuration such that a first group of the fingers are electrically connected to a source contact and a second group of the fingers are electrically connected to a drain contact. At least some of the fingers have a current carrying capacity that varies as a function of location along a direction in which the fingers extend.

In some embodiments, the current carrying capacity can be higher at a proximal end of a given finger than at a distal end of the finger, with the proximal end being adjacent to a respective source or drain contact. The current carrying capacity can decrease in one or more steps. The current carrying capacity can vary continuously for a portion of the length of the finger.

In some embodiments, the finger can include a first metal M1 that extends substantially the entire length of the finger. The first metal M1 can have a tapered profile such that the proximal end has a wider dimension than the distal end. The tapered profile can extend from the proximal end to the distal end.

In some embodiments, the finger can further include a second metal M2 that extends from the proximal end to a selected location along the direction. The second metal M2 can be electrically connected to the first metal M1 to yield the higher current carrying capacity near the proximal end. The second metal M2 can be configured such that the higher current carrying capacity is achieved without an increase in a dimension of the first metal M1. The dimension of the first metal M1 can include a width of the finger. The second metal M2 can be positioned above the first metal M1. The second metal M2 can be separated from the first metal M1 by an electrically insulating layer, with the second metal M2 being electrically connected with the first metal M1 by one or more conductive vias. The second metal M2 can have a substantially constant width that is less than or equal to the width of the first metal M1. The second metal M2 can have a tapered profile between the proximal end and the distal end, with the proximal end having the widest dimension. The second metal M2 can have a tapered portion between the proximal end and an intermediate location, and a straight portion between the intermediate location and the distal end.

In some embodiments, at least one of the first metal M1 and the second metal M2 can be configured such that the higher current carrying capacity is achieved without a significant degradation in off-state capacitance. At least one of the first metal M1 and the second metal M2 can have a tapered profile between the proximal end and the distal end, with the proximal end having the widest dimension. At least one of the first metal M1 and the second metal M2 can have a tapered portion between the proximal end and an intermediate location, and a straight portion between the intermediate location and the distal end.

In some embodiments, the first metal M1 and the second metal M2 can be formed from different metals. In some embodiments, the first metal M1 and the second metal M2 can be formed from substantially the same metal. In some embodiments, the FET can be a silicon-on-insulator (SOI) device.

According to a number of implementations, the present disclosure relates to a radio-frequency (RF) switching device that includes a first terminal and a second terminal, and a plurality of field-effect transistors (FETs) arranged in series to form a stack. One end of the stack is electrically connected to the first terminal and the other end of the stack electrically connected to the second terminal. Each of at least some of the FETs includes a plurality of fingers arranged in an interleaved configuration such that a first group of the fingers are electrically connected to a source contact and a second group of the fingers are electrically connected to a drain contact. At least some of the fingers have a current carrying capacity that varies as a function of location along a direction in which the fingers extend to yield a reduced ON-resistance (Ron) of the FET.

In a number of teachings, the present disclosure relates to a semiconductor die that includes a semiconductor substrate a plurality of field-effect transistors (FETs) formed on the semiconductor substrate. The FETs are arranged in series to form a stack, with each of at least some of the FETs including a plurality of fingers arranged in an interleaved configuration such that a first group of the fingers are electrically connected to a source contact and a second group of the fingers are electrically connected to a drain contact. At least some of the fingers have a current carrying capacity that varies as a function of location along a direction in which the fingers extend to yield a reduced ON-resistance (Ron) of the FET.

According to some implementations, the present disclosure relates to a method for fabricating a radio-frequency (RF) switching device. The method includes providing a semiconductor substrate. The method further includes forming a plurality of field-effect transistors (FETs) on the semiconductor substrate, with each of at least some of the FETs including a plurality of fingers arranged in an interleaved configuration such that a first group of the fingers are electrically connected to a source contact and a second group of the fingers are electrically connected to a drain contact. At least some of the fingers have a current carrying capacity that varies as a function of location along a direction in which the fingers extend to yield a reduced ON-resistance (Ron) of the FET. The method further includes connecting the FETs in series to form a stack.

In some implementations, the present disclosure relates to a radio-frequency (RF) switching module that includes a packaging substrate configured to receive a plurality of components. The module further includes a die mounted on the packaging substrate. The die includes a switching circuit having a plurality of field-effect transistors (FETs) connected in series to form a stack. Each of at least some of the FETs includes a plurality of fingers arranged in an interleaved configuration such that a first group of the fingers are electrically connected to a source contact and a second group of the fingers are electrically connected to a drain contact. At least some of the fingers have a current carrying capacity that varies as a function of location along a direction in which the fingers extend to yield a reduced ON-resistance (Ron) of the FET.

In accordance with some implementations, the present disclosure relates to a wireless device that includes a transmitter and a power amplifier in communication with the transmitter. The power amplifier is configured to amplify an RF signal generated by the transmitter. The wireless device further includes an antenna configured to transmit the amplified RF signal. The wireless device further includes a switching circuit configured to route the amplified RF signal from the power amplifier to the antenna. The switching circuit includes a plurality of field-effect transistors (FETs) connected in series to form a stack. Each of at least some of the FETs includes a plurality of fingers arranged in an interleaved configuration such that a first group of the fingers are electrically connected to a source contact and a second group of the fingers are electrically connected to a drain contact. At least some of the fingers have a current carrying capacity that varies as a function of location along a direction in which the fingers extend to yield a reduced ON-resistance (Ron) of the FET.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

FIG. 17B shows an example configuration where an M2 metal having an increased width is shown to be electrically connected to a partially tapered M2 metal implemented over a partially tapered M1 metal of a finger feature.

DETAILED DESCRIPTION OF SOME EMBODIMENTS

The headings provided herein, if any, are for convenience only and do not necessarily affect the scope or meaning of the claimed invention.

In antenna tuning or some other switching applications such as radio-frequency (RF) switches and passive components, a plurality of switching elements (e.g., field-effect transistors (FET)) can be used as passive components. They are commonly arranged in a stack configuration to facilitate appropriate handling of power. For example, a higher FET stack height can be utilized to allow an RF switch to withstand high power under mismatch.

Such higher number of FETs can be arranged in series to meet the voltage handling requirements when the FETs are in an OFF state. However, such an increase in the number of FETs may not be ideal in some situations. For example, degradation in ON-resistance (Ron) performance can occur when the FETs are in an ON state. It is noted that the total ON-resistance (Ron_total) of the stack is approximately equal to the stack height (stack_height) times the ON-resistance of a single FET (Ron_single_FET), assuming that all FETs have the same value of Ron_single_FET. For the voltage handling capability, the total voltage handling capacity (Vhandling) of the stack is typically much less than the product of the stack height (stack_height) and the voltage handling capacity of a single FET (Vhandling_single_FET). Thus, in some situations, Ron can degrade faster than the voltage handling improvement.

In many FET-based devices such as an RF switching stack, designs call for lowest Ron devices possible. For example, a lower Ron value can facilitate matching network designs with lower energy loss. However, with smaller packages, very low Ron designs are not feasible or practical. If the size of a FET increases, Ron typically decreases. However, at certain point, the FET size cannot be increased anymore without impacting other important parameters.

As described herein, one or more features of the present disclosure can allow reduction of the total Ron while maintaining or improving other desirable features. For example, device size of a FET having one or more features as described herein can be maintained or even reduced.

Figure 1:
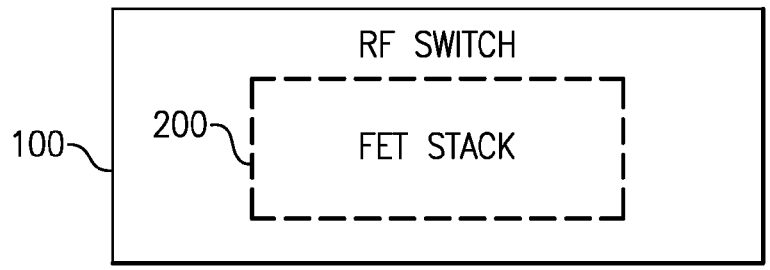
FIG. 1 depicts a radio-frequency (RF) switch that includes a field-effect transistor (FET) stack having one or more features as described herein.

FIG. 1 schematically shows an RF switch 100 having a FET stack 200 having one or more features as described herein. Various examples of such features are described herein in greater detail.

For the purpose of description, it will be understood that FETs can include, for example, metal-oxide-semiconductor FETs (MOSFETs) such as SOI MOSFETs. It will also be understood that FETs as described herein can be implemented in other process technologies, including but not limited to HEMT, SOI, silicon-on-sapphire (SOS), and CMOS technologies. It will also be understood that one or more features of the present disclosure can also be implemented in other types of transistors and/or other types of switching devices.

Figure 2:
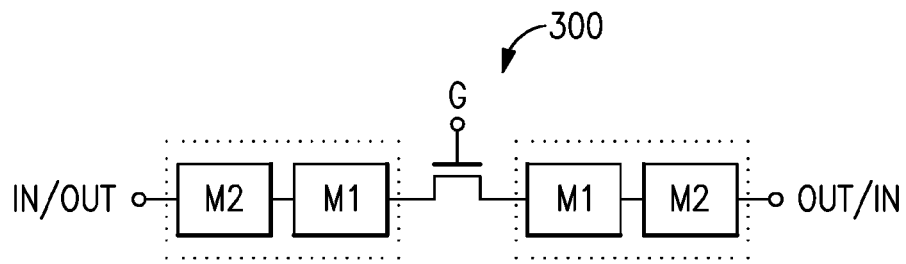
FIG. 2 depicts a FET having a gate coupled to a gate node G, a source coupled to an input node through first and second metals (M1 and M2), and a drain coupled to an output node through first and second metals (M1 and M2).

FIG. 2 schematically depicts a FET 300 having a gate coupled to a gate node G, a source coupled to an input node through first and second metals (M1 and M2), and a drain coupled to an output node through first and second metals (M1 and M2). In some embodiments, the source and the drain, and thus their respective nodes, can be operated in reverse. Hence, the input on the left side can function as an output, and the output on the right side can function as an input.

Described herein are various examples of how the second metal M2 can be configured in conjunction with the first metal M1 to yield desirable features such as reduced resistance between the input and output nodes. For example, when the FET is in an ON state, reduced resistance associated with M1 and M2, combined with the intrinsic Ron value of the FET, can yield such a reduced resistance between the input and output nodes. Also described herein are examples of how the first metal M1 itself can be configured to provide one or more desirable features, with or without the second metal M2.

Figure 3:
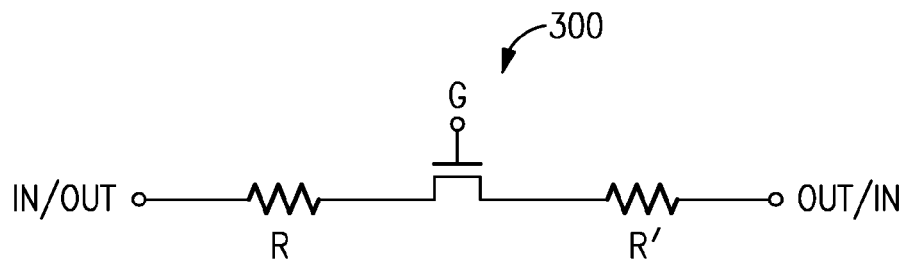
FIG. 3 shows a circuit representation of resistances R and R' that can be provided by M1 and M2 between an In/Out node and a source/drain of a FET, and a drain/source of the FET and an Out/In node, respectively.

FIG. 3 shows a circuit representation of resistances R and R' that can be provided by M1 and M2 between an In/Out node and a source/drain of a FET 300, and a drain/source of the FET 300 and an Out/In node, respectively. As described herein, M1 and M2 can be configured so as to provide reduce resistance values for R and/or R'. In some embodiments, such reduced resistance values can be achieved without increasing the overall area of the FET 300 and its related electrical connection features such as M1 features. In some embodiments, such an overall area can even be reduced while providing desired resistance values for R and R'.

In various examples described herein, it will be assumed that resistances R and R' are generally the same. However, it will be understood that R and R' can be different. For example, R can be greater than R', or R can be less than R'.

Figure 4:
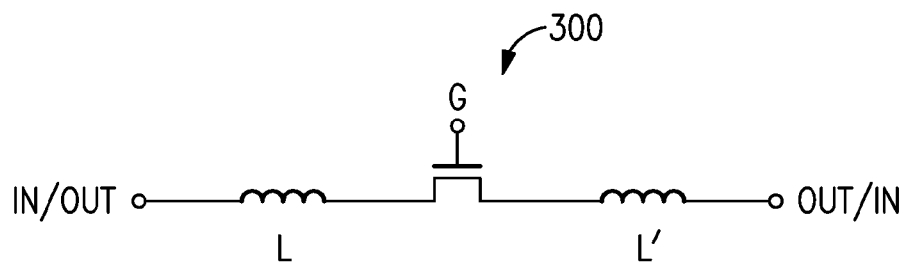
FIG. 4 shows that in some situations electrical connection features can also yield inductances L and L' provided by M1 and M2 between the In/Out node and the source/drain of the FET, and the drain/source of the FET and the Out/In node, respectively.

Various examples herein are described in the context of resistance values R and R' associated with electrical connection features for the source and drain of a FET (e.g., 300 in FIG. 3). In some situations, and as shown in FIG. 4, such electrical connection features can also yield inductances L and L' provided by M1 and M2 between the In/Out node and the source/drain of the FET 300, and the drain/source of the FET 300 and the Out/In node, respectively.

In some embodiments, M1 and M2 can be configured so as to provide desired inductance values for L and/or L'. In some embodiments, such desired inductance values can be achieved without increasing the overall area of the FET 300 and its related electrical connection features such as M1 features. In some embodiments, such an overall area can even be reduced while providing desired inductance values for L and L'. In some embodiments, L can be approximately the same as L', L can be greater than L', or L can be less than L'.

Figure 5:
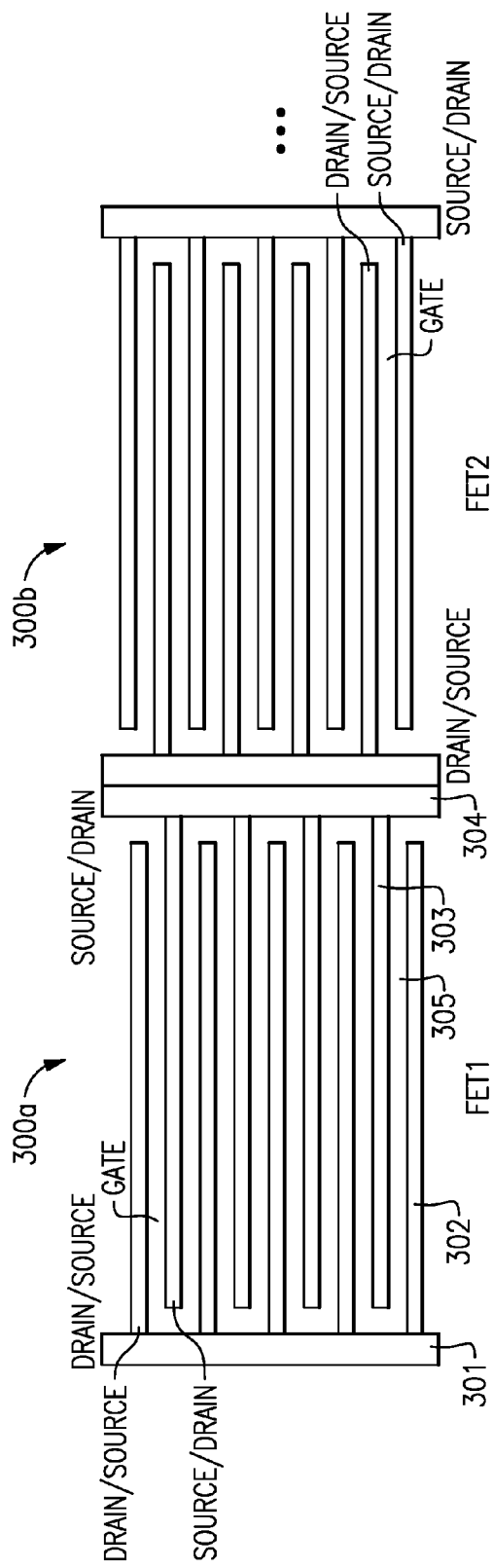
FIG. 5 shows that in some embodiments, one or more features of the present disclosure can be implemented in one or more FETs having a finger configuration.

FIG. 5 shows that in some embodiments, one or more features of the present disclosure can be implemented in one or more FETs having a finger configuration. In FIG. 5, a plurality of FETs 300a, 300b, etc. are shown to be arranged in series. Although described in such a context, it will be understood that one or more features of the present disclosure can also be implemented in a single FET.

In the example shown in FIG. 5, an M1 feature 304 on the right side of each FET (e.g., 300a) can function as a source contact, and an M1 feature 301 on the left side can function as a drain contact. It will be understood that the FET can be operated in reverse, such that M1 feature 301 functions as a source, and M1 feature 304 functions as a drain.

In the example shown in FIG. 5, the drain contact 301 can be function as an output (e.g., an RF output) of the FETs arranged in series. The source contact 304 can be electrically connected to a drain contact of the FET 300b. Similarly, the source contact of the FET 300b can be electrically connected to a drain contact of the next FET, and so on.

In a given FET (e.g., 300a), a plurality of finger features 303 are shown to be electrically connected to the source contact 304, and a plurality of finger features 302 are shown to be electrically connected to the drain contact 301. The foregoing two sets of finger features 303, 302 are shown to be arranged in an interleaved configuration with each other. As is generally understood, a gate feature 305 can be provided in the spaced between the interleaved finger features 303, 302 associated with the source and drain contacts 304, 301.

In some embodiments, a second metal (M2) can be provided for the fingers 303, 302 and/or the source/drain contacts 304, 301. Various examples of such M2 configurations are described herein in greater detail.

Figure 6:
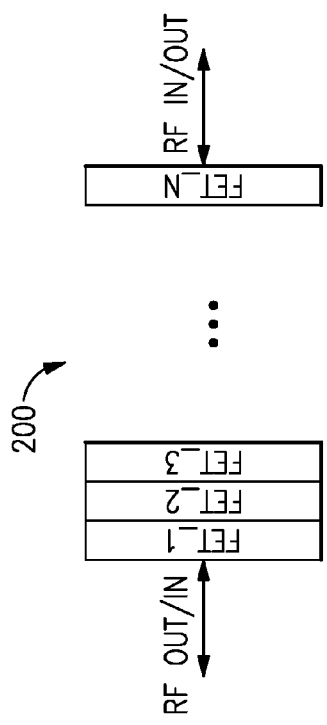
FIG. 6 shows that a plurality of FETs having one or more features as described herein can be arranged in series so as to yield a stack configuration.

FIG. 6 shows that a plurality of FETs having one or more features as described herein can be arranged in series (such as the example of FIG. 5) so as to yield a stack configuration 200. In FIG. 6, the example stack 200 is shown to include N of such FETs (e.g., finger-configuration FETs) (FET_1, FET_2, ..., FET_N). In some embodiments, some or all of such FETs can include one or more features associated with reduced-resistance as described herein.

For the purpose of describing various examples, suppose that a fingers of a FET extend along, for example, an x-direction. In an example shown in FIG. 7, a finger 302 is shown to extend along an x-axis from a source/drain contact 301. Similarly, a finger 303 is shown to in a direction parallel to the x-axis from a drain/source contact 304.

In some embodiments, a finger (e.g., 302, 303) can be configured to provide a varying conductance profile to provide improved flow of current. Such a varying conductance profile can be implemented in different ways, including, for example, providing an additional pathway above an M1 finger structure at one or more selected locations. In some embodiments, such an additional pathway can include, for example, a thicker M1 finger structure at such selected location(s), a shaped M1 structure, and/or an additional metal layer such as an M2 structure. In some embodiments, such an additional pathway can be configured while generally retaining the same M1 finger layout footprint.

FIGS. 8-12 show various examples associated with finger features having the foregoing variable conductance profiles. FIGS. 13 and 14 shows that in some embodiments, increased conductance (e.g., by an additional metal layer such as an M2 structure) can be provided for the source/drain contacts (e.g., M1 structures) so as to accommodate the increased conductance of a plurality of the foregoing fingers. FIGS. 15-17 show non-limiting examples of configurations that show both of the increased conductance capabilities of the fingers and the source/drain contacts.

Figure 7:
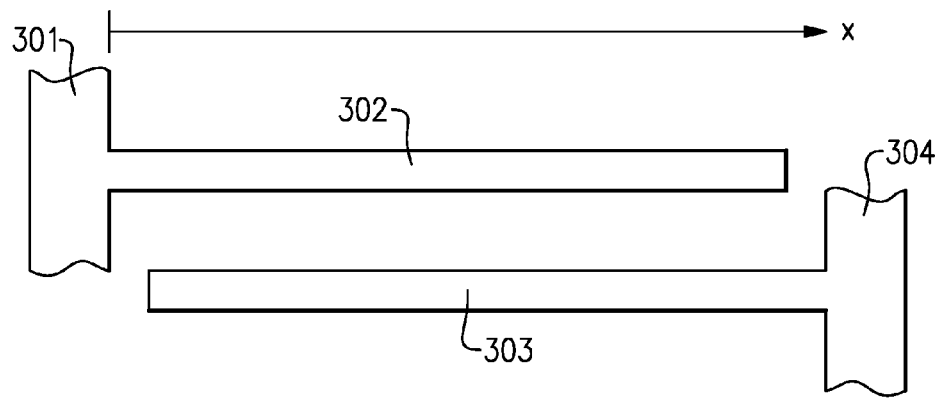
FIG. 7 shows an example where fingers extend along an x-axis from source/drain contacts.
Figure 8:
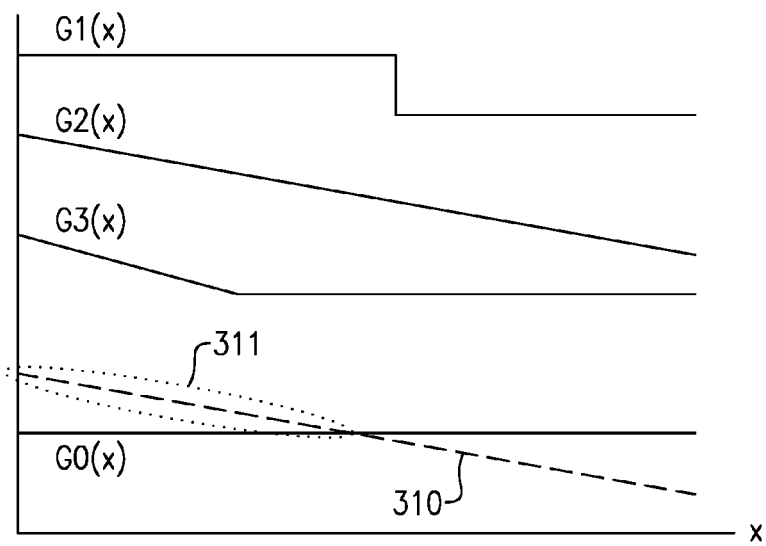
FIG. 8 shows that in some embodiments, variable conductance associated with a finger can be implemented in different ways.

FIG. 8 shows that a variable conductance associated with a finger can be implemented in different ways. For the purpose of description, suppose that the x-axis of FIG. 8 represents the example x-direction of the example finger 302 of FIG. 7. For such a finger, there is relatively little current at or near the distal end (on the right side), and more current at or near the proximal end (on the left side connected to the source/drain contact 301. For the purpose of description, suppose such a current density varies as a function of x as depicted by a curve 310.

As further shown in FIG. 8, if the finger 302 has a uniform cross-sectional shape, its conductance G0 or current-carrying capacity can be generally uniform along its length. Towards the distal end where there is relatively little current, such a uniform current-carrying capacity may be sufficient. However, towards the proximal end where there is more current, such a uniform current-carrying capacity may not be sufficient. In FIG. 8, a portion indicated as 311 can be the actual current that needs to be carried, but is not due to the uniform current-carrying capacity. In terms of resistance, such a uniform current-carrying capacity translates to a uniform resistance as a function of x. Overall, the example finger having the uniform cross-sectional shape can have a resistance value that is higher than desired.

FIG. 8 shows non-limiting examples of how conductance associated with a finger 302 can be configured to vary as a function of distance from its corresponding source/drain contact (e.g., 301 in FIG. 7). In each of the examples, the foregoing current distribution along the x-direction is assumed.

In an example, a conductance profile G1 can include two or more conductance values, with each conductance value being generally uniform in a corresponding range of x. For example, a region near the proximal end of the finger can have a higher uniform conductance value than a uniform conductance value near the distal end. An example of such a configuration is described herein in greater detail.

In another example, a conductance profile G2 can include a continuous-curve profile. Such a curve can have a higher value near the proximal end of the finger, and decrease in value towards the distal end. An example of such a configuration is described herein in greater detail.

In yet another example, a conductance profile G3 can include a combination of a continuously-varying portion and a uniform portion. Such a continuously-varying portion can have a higher value near the proximal end of the finger, and decrease in value as x increases; and at some selected value of x, conductance value can be generally uniform. An example of such a configuration is described herein in greater detail.

Figure 9:
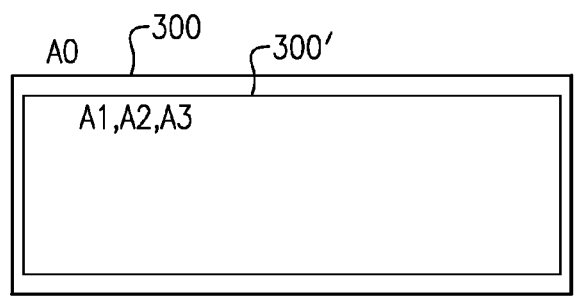
FIG. 9 shows that in some embodiments, increased-conductance configurations can be implemented such that the overall layout area of a FET is either maintained or even reduced.

FIG. 9 shows that in some embodiments, the foregoing increased-conductance configurations can be implemented such that the overall layout area (A1, A2, A3 corresponding to G1, G2, G3 of FIG. 8) of the FET (300') is either maintained (relative to area A0 corresponding to G0 in FIG. 8) or even reduced.

Figure 10:
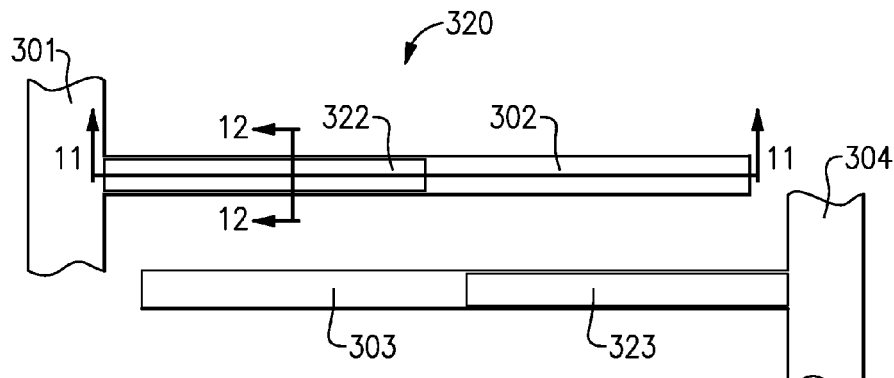
FIG. 10 shows a plan view of a metal layout configuration where an M2 metal can be implemented over an M1 metal finger.

FIG. 10 shows a plan view of a metal layout configuration 320 where an M2 metal 322 can be implemented over an M1 metal finger 302. The M1 finger 302 is shown to be coupled to a source/drain contact 301. Similarly, an M2 metal 323 can be implemented over an M1 metal finger 303 which is coupled to a drain/source contact 304. Sectional views shown in FIGS. 11 and 12 are some non-limiting examples of how M2 can be configured relative to M1.

Figure 11A:
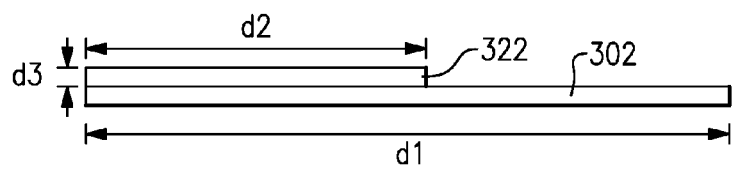
FIG. 11A shows a side view of the M2 metal implemented over the M1 metal, with a proximal end relative to a source/drain contact.

FIG. 11A shows a side view of the M2 metal 322 implemented over the M1 metal 302 (having a length d1 along the x-direction), with the left side being the proximal end (relative to the source/drain contact 301). In some embodiments, the proximal end of the M2 metal 322 can be at a location that is at or close to the location of the proximal end of the M1 metal 302. The length of the M2 metal 322 is shown to have a length dimension d2; and such a dimension can vary along the x-direction. The M2 metal 322 is also shown to have a thickness dimension d3; and such a dimension can also vary.

Figure 11B:
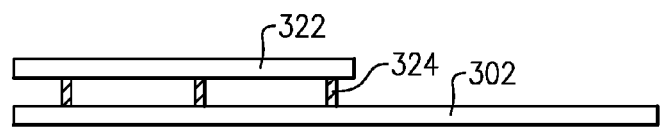
FIG. 11B shows that in some embodiments, the M2 metal can be implemented as a layer separated from the M1 metal layer.

FIG. 11B shows that in some embodiments, the M2 metal 322 can be implemented as a layer separated from the M1 metal layer 302. Such separated M1 and M2 metal layers 302, 322 can be electrically connected by one or more conductive vias 324 or other electrical connection features. In some embodiments, such conductive vias can be configured (e.g., number, placement, and/or dimensions of vias) to facilitate, for example, improved current capacity provided by a combination of M1 and M2. In some embodiments, the space between the two separated M1 and M2 metal layers 302, 322 can be occupied by, for example, an electrically insulating layer such as a dielectric layer.

Figures 12A, 12B, 12C:
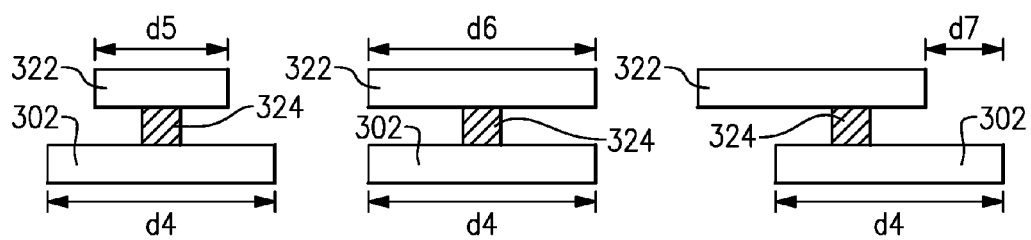
FIGS. 12A-12C show cross-sectional views of different examples of how the width and/or lateral position of the M2 metal can be configured relative to the M1 metal.
Figure 13:
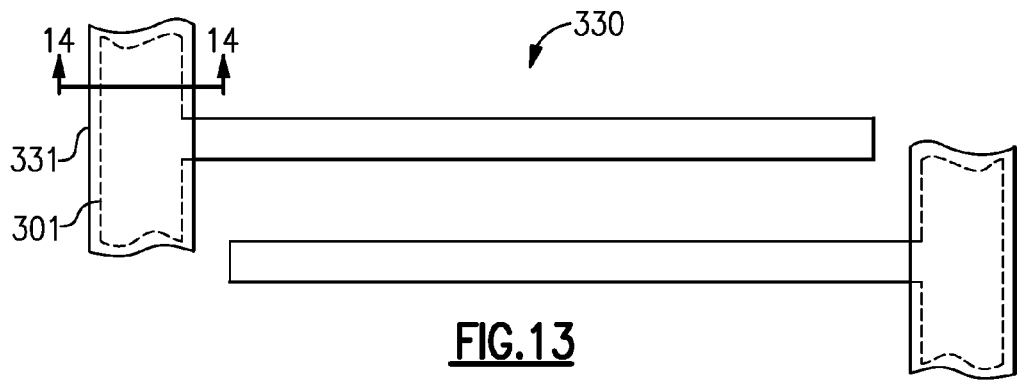
FIG. 13 shows a plan view of a metal layout configuration where an M2 metal can be implemented over an M1 metal of a source/drain contact.

FIGS. 12A-12C are cross-sectional views of different examples of how the width and/or lateral position of the M2 metal 322 can be configured relative to the M1 metal 302 (having width d4). As shown in the example of FIG. 12A, the width (d5) of M2 322 can be less than the width (d4) of M1 302.

In the example of FIG. 12B, the width (d6) of M2 322 can be approximately same as the width (d4) of M1 302. In some embodiments, the width of M2 322 can be greater than the width of M1 302; and such a configuration can be implemented without significant degradation in performance associated with capacitive coupling with, for example, a neighboring M2 and/or M1.

In each of the examples of FIGS. 12A and 12B, M2 322 is shown to be generally centered relative to M1 302. However, and as shown in the example of FIG. 12C, M2 322 (whether or not having same width as M1 302) can be laterally offset (e.g., by an amount d7) from M1 302.

FIG. 13 shows a plan view of a metal layout configuration 330 where an M2 metal 331 can be implemented over an M1 metal of a source/drain contact 301. Sectional views shown in FIGS. 14A-14D are some non-limiting examples of how M2 of FIG. 13 can be configured relative to M1. In the examples of FIGS. 14A-14D, the M2 metal layers 331 can be electrically connected to their respective source/drain contact layers 301 by one or more conductive vias 334. The space between the two separated M1 and M2 metal layers 301, 331 can be occupied by, for example, an electrically insulating layer such as a dielectric layer.

Figure 14A:
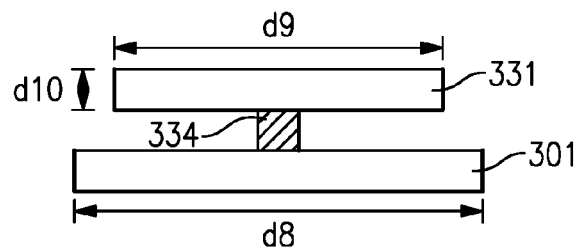
FIGS. 14A-14D show sectional views of examples of how M2 of FIG. 13 can be configured relative to M1.
Figure 15:
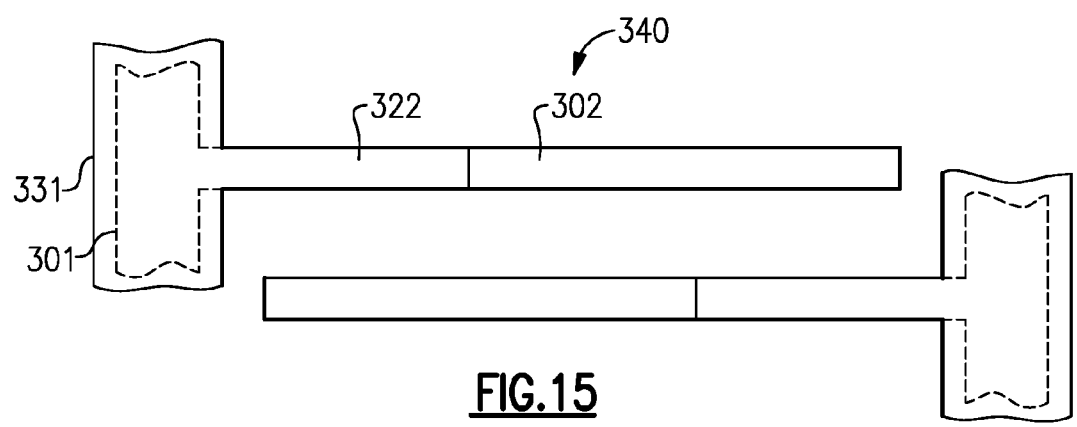
FIG. 15 shows an example configuration where an M2 metal having an increased width is shown to be electrically connected to an M2 metal implemented over an M1 metal of a finger feature.

FIG. 14A shows that in some embodiments, the M2 metal layer 331 can have a width dimension (d9) that is less than the width (d8) of the M1 metal layer 301. In FIG. 14A, the M2 metal layer 331 is shown to have a thickness of d10.

Figure 14B:
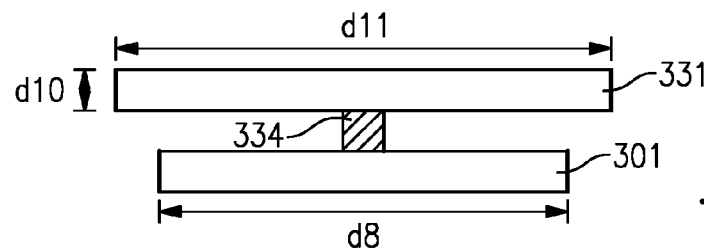

FIG. 14B shows that in some embodiments, the M2 metal layer 331 can have a width (d11) that is greater than the width (d8) of the M1 metal layer 301. In some situations, such a wider-than-M1 dimension for M2 can be implemented, since finger-to-finger coupling is likely not affected much by such a configuration. In some embodiments, the width of the M2 metal layer 331 can also be approximately same as the M1 metal layer 301.

Figure 14C:
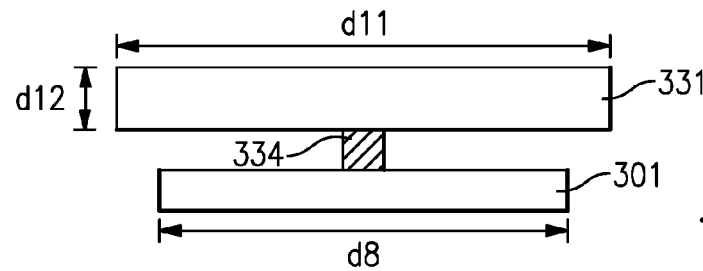

FIG. 14C shows that in some embodiments, the thickness (d12) of the M2 metal layer 332 can vary. For example, if the lateral dimension expansion is not practical beyond some threshold value, current-carrying capacity of the source/drain contact can be still be improved by increasing the thickness of the M2 metal layer 332.

Figure 14D:
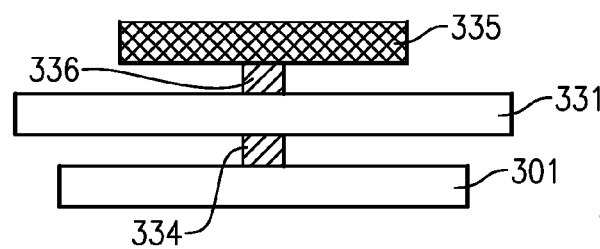

FIG. 14D shows that in some embodiments, an additional metal layer 335 can be added over the M2 metal layer 331 to provide, for example, additional current carrying capacity. The dimensions of the additional metal layer 335 can be varied in a similar manner as the M2 metal layer 331 as described herein.

FIGS. 15-17 show examples where one or more features described in reference to FIGS. 7-12 can be combined with one or more features described in reference to FIGS. 13 and 14. For the purpose of description of FIGS. 15-17, it will be assumed that an M2 metal 331 is wider than an M1 metal of the source/drain contact 301 to accommodate the increased current carrying capacities of the associated finger features 302. Because such an increased-width M2 extends in a direction that is generally perpendicular to the fingers, its coupling effects such as mutual inductance with the fingers can remain unchanged or change relatively little at an acceptable level. It will be understood that other configurations of M2 can also be utilized.

Example 1:

In an example configuration 340 of FIG. 15, the M2 metal 331 having an increased width is shown to be electrically connected to an M2 metal 322 implemented over the M1 metal of a finger feature 302. In the example, the M2 metal 322 can be configured as described herein (e.g., in FIGS. 10-12), and such a configuration can yield a current carrying capacity profile similar to G1 described in reference to FIG. 8.

Figure 16A:
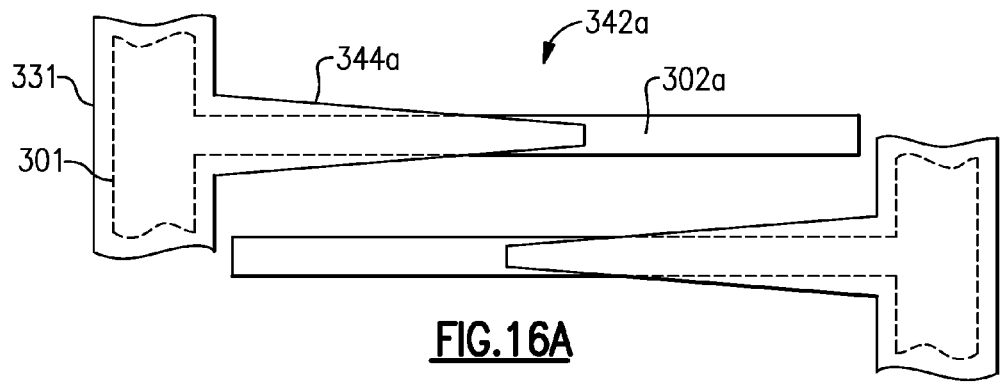
FIG. 16A shows an example configuration where an M2 metal having an increased width is shown to be electrically connected to a tapered M2 metal implemented over an M1 metal of a finger feature.

Example 2:

In an example configuration 342a of FIG. 16A, the M2 metal 331 having an increased width is shown to be electrically connected to an M2 metal 344a implemented over the M1 metal of a finger feature 302a. In the example, the M2 metal 344a can be configured as described herein (e.g., in FIGS. 10-12), and such a configuration can yield a current carrying capacity profile similar to G2 described in reference to FIG. 8.

More particularly, the M2 metal 344a is shown to include a gradual taper where the width of M2 344a decreases gradually from the proximal end to the distal end. In some embodiments, the width of M2 344a at the proximal end can be greater than the width of the M1 metal 302a. In some embodiments, the width of M2 344a at the distal end can be less than the width of the M1 metal 302a. Further, and as shown in FIG. 16A, the M2 metal 344a can extend along the x-axis, such that some of the distal end portion overlaps in x-direction with a neighboring finger's M2 metal.

Figure 16B:
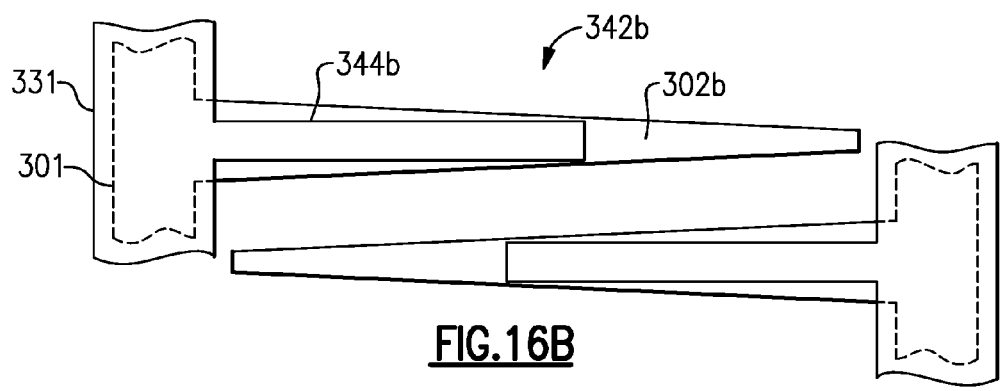
FIG. 16B shows an example configuration where an M2 metal having an increased width is shown to be electrically connected to an M2 metal implemented over a tapered M1 metal of a finger feature.

In another example configuration 342b of FIG. 16B, the M2 metal 331 having an increased width is shown to be electrically connected to an M2 metal 344b implemented over the M1 metal of a finger feature 302b. In the example, M1 and/or M2 metal(s) 302b/344b can be configured as described herein (e.g., in FIGS. 10-12), and such a configuration can yield a current carrying capacity profile similar to one or more examples described in reference to FIG. 8.

More particularly, the M1 metal 302b is shown to include a gradual taper where the width of M1 302b decreases gradually from the proximal end to the distal end. In some embodiments, the width of M1 302b at the proximal end can be greater than the width of the M2 metal 344b. In some embodiments, the width of M1 302b at the distal end can be less than the width of the M2 metal 344b.

Figure 16C:
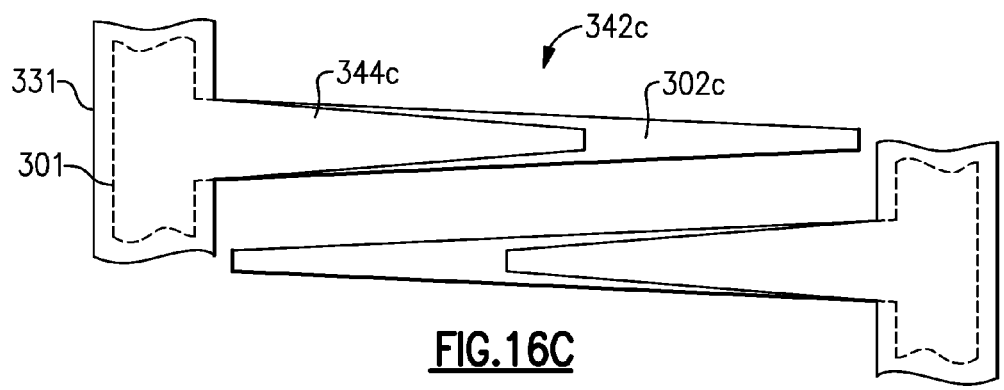
FIG. 16C shows an example configuration where an M2 metal having an increased width is shown to be electrically connected to a tapered M2 metal implemented over a tapered M1 metal of a finger feature.

In yet another example configuration 342c of FIG. 16C, the M2 metal 331 having an increased width is shown to be electrically connected to an M2 metal 344c implemented over the M1 metal of a finger feature 302c. In the example, M1 and/or M2 metal(s) 302c/344c can be configured as described herein (e.g., in FIGS. 10-12), and such a configuration can yield a current carrying capacity profile similar to one or more examples described in reference to FIG. 8.

More particularly, the M1 metal 302c is shown to include a gradual taper where the width of M1 302c decreases gradually from the proximal end to the distal end. Similarly, the M2 metal 344c is shown to also include a gradual taper where the width of M2 344c decreases gradually from the proximal end to the distal end.

Typically, modifications to M1 metals to reduce their resistance loss can result in degradation of off-state capacitance (Coff). However, in the examples of FIGS. 16B and 16C, the resulting reductions in on-resistance (Ron) can be achieved without significant penalty in Coff.

In some embodiments, the taper of the M1 and/or M2 metal(s) 302/344 described in reference to FIGS. 16A-16C can be implemented so as to yield a smooth current carrying capacity profile between its proximal and distal ends. For the combination of M1 302 and M2 344, there may or may not be a non-smooth transition in the current carrying capacity profile at or near the x-location corresponding to the distal end of M2.

Figure 16D:
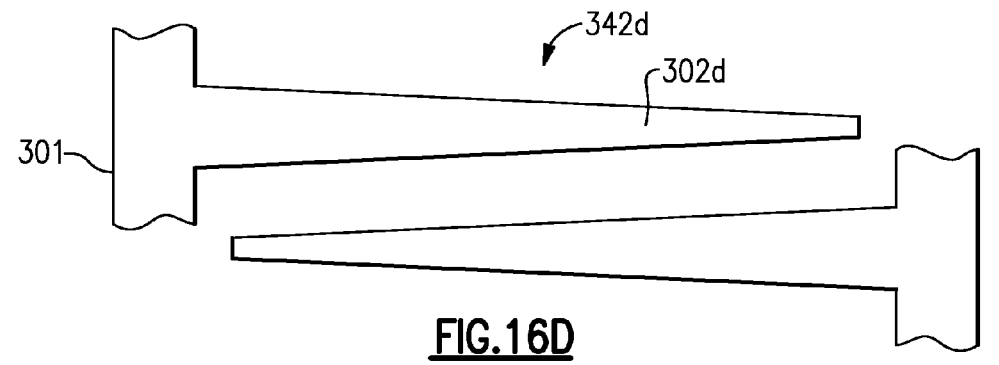
FIG. 16D shows that in some embodiments, an M1 metal alone can be configured to provide one or more features as described herein.

FIG. 16D shows that in some embodiments, a configuration 342d can include an M1 metal of a finger feature 302d (connected to a source/drain contact 301) configured to yield a desirable current carrying capacity profile as described herein, such that it can be utilized with or without an M2 metal. In the example of FIG. 16D, the M1 metal of the finger feature 302d is shown to have a gradual taper similar to the example described in reference to FIGS. 16B and 16C, and be utilized without an M2 metal. It will be understood that the M1 metal of the finger feature 302d can also be implemented in other configurations when utilized without an M2 metal.

Figure 17A:
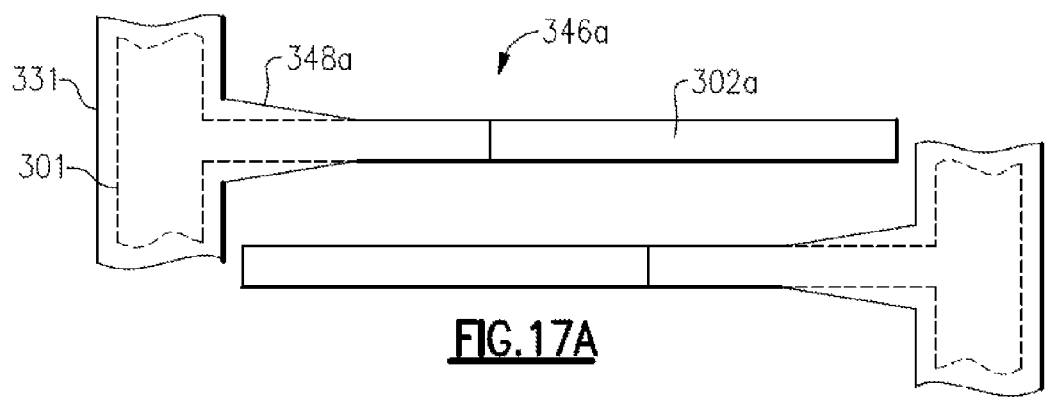
FIG. 17A shows an example configuration where an M2 metal having an increased width is shown to be electrically connected to a partially tapered M2 metal implemented over an M1 metal of a finger feature.

Example 3:

In an example configuration 346a of FIG. 17A, the M2 metal 331 having an increased width is shown to be electrically connected to an M2 metal 348a implemented over the M1 metal of a finger feature 302a. In the example, the M2 metal 348a can be configured as described herein (e.g., in FIGS. 10-12), and such a configuration can yield a current carrying capacity profile similar to G2 described in reference to FIG. 8.

More particularly, the M2 metal 348a is shown to include a tapered portion followed by a fixed-width portion. The tapered portion is shown to have a width that decreases gradually from the proximal end to an intermediate x-location at which the fixed-width portion begins. In some embodiments, the width of M2 348a at the proximal end can be greater than the width of the M1 metal 302a. In some embodiments, the fixed width of M2 348 can be approximately the same as the width of the M1 metal 302a.

Figure 17B:
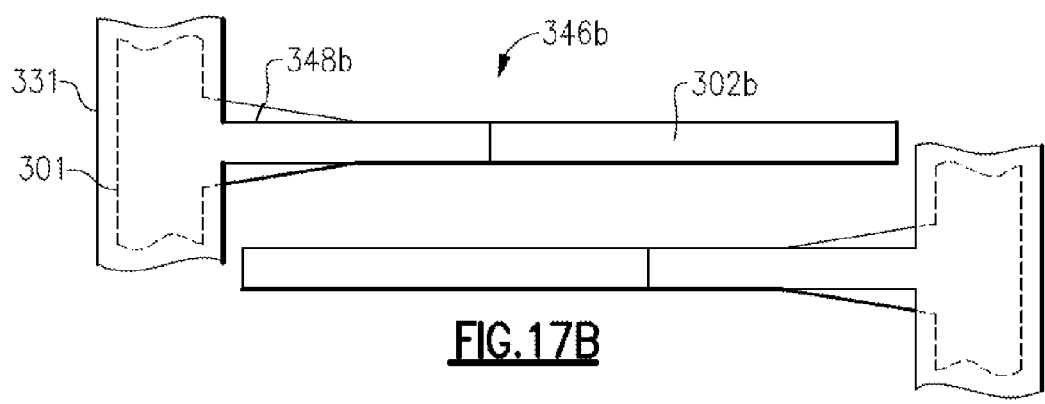
FIG. 17B shows an example configuration where an M2 metal having an increased width is shown to be electrically connected to an M2 metal implemented over a partially tapered M1 metal of a finger feature.

In another example configuration 346b of FIG. 17B, the M2 metal 331 having an increased width is shown to be electrically connected to an M2 metal 348b implemented over the M1 metal of a finger feature 302b. In the example, the M2 metal 348b can be configured as described herein (e.g., in FIGS. 10-12), and such a configuration can yield a current carrying capacity profile similar to one or more examples described in reference to FIG. 8.

More particularly, the M1 metal 302b is shown to include a tapered portion followed by a fixed-width portion. The tapered portion is shown to have a width that decreases gradually from the proximal end to an intermediate x-location at which the fixed-width portion begins. In some embodiments, the width of M1 302b at the proximal end can be greater than the width of the M2 metal 348b. In some embodiments, the fixed width of M1 302b can be approximately the same as the width of the M2 metal 348b.

Figure 17C:
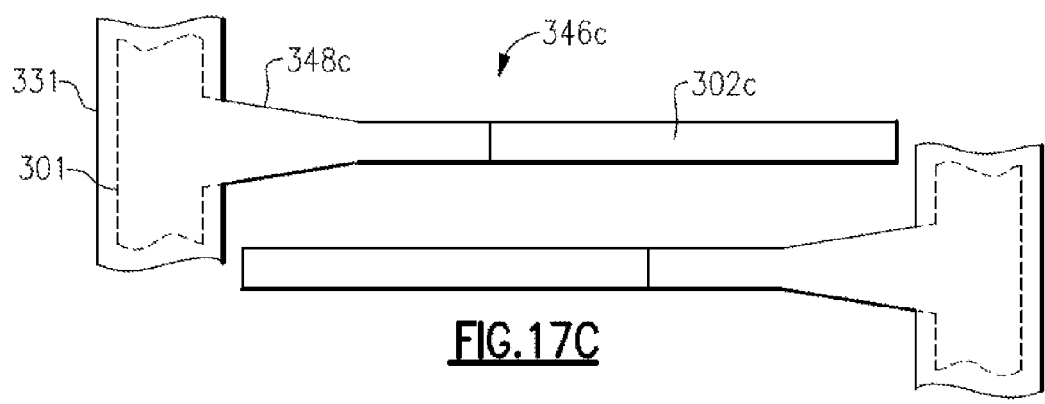
FIG. 17D shows that in some embodiments, an M1 metal alone can be configured to provide one or more features as described herein.

In yet another example configuration 346c of FIG. 17C, the M2 metal 331 having an increased width is shown to be electrically connected to an M2 metal 348c implemented over the M1 metal of a finger feature 302c. In the example, the M2 metal 348c can be configured as described herein (e.g., in FIGS. 10-12), and such a configuration can yield a current carrying capacity profile similar to one or more examples described in reference to FIG. 8.

More particularly, the M1 metal 302c is shown to include a tapered portion followed by a fixed-width portion. The tapered portion is shown to have a width that decreases gradually from the proximal end to an intermediate x-location at which the fixed-width portion begins. Similarly, the M2 metal 348c is shown to include a tapered portion followed by a fixed-width portion. The tapered portion is shown to have a width that decreases gradually from the proximal end to an intermediate x-location at which the fixed-width portion begins. In some embodiments, the width of M1 302c at the proximal end can be greater than the width of the fixed-width portion of the M2 metal 348c. In some embodiments, the width of M2 348c at the proximal end can be greater than the width of the fixed-width portion of the M1 metal 302c. In some embodiments, the fixed-width portion of M1 302c can be approximately the same as the fixed-width of M2 348c.

Typically, modifications to M1 metals to reduce their resistance loss can result in degradation of off-state capacitance (Coff). However, in the examples of FIGS. 17B and 17C, the resulting reductions in on-resistance (Ron) can be achieved without significant penalty in Coff.

In some embodiments, the tapered portion of the M1 and/or M2 metal(s) 302/348 described in reference to FIGS. 17A-17C can be implemented so as to yield a smooth current carrying capacity profile. For the combination of M1 302 and M2 348, there may be a non-smooth transition in the current carrying capacity profile at or near the intermediate x-location where the tapered portion meets with the fixed-width portion, as well as a or near the x-location corresponding to the distal end of M2.

Figure 17D:
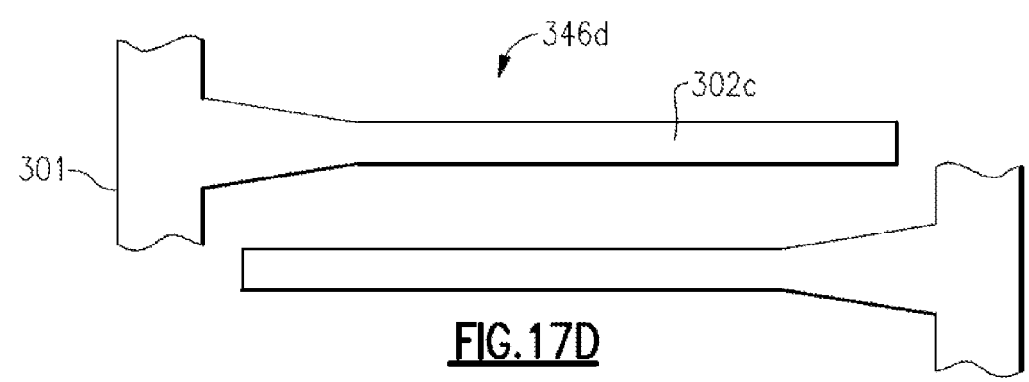

FIG. 17D shows that in some embodiments, a configuration 346d can include an M1 metal of a finger feature 302d (connected to a source/drain contact 301) configured to yield a desirable current carrying capacity profile as described herein, such that it can be utilized with or without an M2 metal. In the example of FIG. 17D, the M1 metal of the finger feature 302d is shown to include a tapered portion followed by a fixed-width portion similar to the example described in reference to FIGS. 17B and 17C, and be utilized without an M2 metal. It will be understood that the M1 metal of the finger feature 302d can also be implemented in other configurations when utilized without an M2 metal.

Examples of Metals in M1 and M2:

In the various examples described herein, it will be understood that M1 and M2 metals may or may not be the same metal. In some embodiments, an M1 metal having one or more features as described herein can be implemented with a metal that is commonly used as FET finger contacts. In some embodiments, an M2 metal having one or more features as described herein can be implemented with the same metal as M1, or with a metal that is commonly used for interconnects.

Examples of Improvement in Performance:

As described herein, the ON-resistance (Ron) of a FET can be decreased by increasing the size of the FET. For example, the width of each source/drain finger can be increased. However, such an increase is typically limited due to other FET parameter(s) that degrade performance as size is increased.

Table 1 lists various sized FETs and reductions in Ron that can be expected with the example configuration 342 of FIG. 16. In Table 1, the FET size refers to a product of a unit finger width (e.g., dimension d1 in FIG. 11A) and a number of gate fingers in the FET (e.g., where one gate finger is between a source finger and a drain finger). For example, if a given FET has 100 gate fingers with each unit finger width having a width of 10 μms, the FET size will be 10 μm×100=1 mm for the purpose of description of the example of Table 1. The normalized Ron is calculated as 1 Ohm divided by the FET size. The Ron values with and without M2 are results obtained from simulation.

TABLE 1

| FET size (μm) | Normalized Ron (Ohms) | Ron without M2 (Ohms) | Ron with M2 (Ohms) | Relative decrease in Ron |
| --- | --- | --- | --- | --- |
| 0.5 | 2.0 | 2.42 | 1.873 | 22% |
| 1.0 | 1.0 | 1.203 | 0.944 | 21% |
| 4.0 | 0.25 | 0.311 | 0.238 | 23% |
| 8.0 | 0.125 | 0.155 | 0.119 | 23% |

As shown in the examples of Table 1, the example configuration 342 of FIG. 16 can provide a significant decrease in Ron (e.g., at least 20% reduction) for different sized FETs, while maintaining the FET sizes the same.

In an example test result, Applicant has observed that there is very little degradation in overall capacitive coupling in a given FET device, much less than what was expected. Accordingly, for a given design, one can achieve significantly lower resistance loss without necessarily incurring degradation in capacitive coupling, and therefore obtain improved performance in harmonics, intermodulation distortion, etc., by utilizing one or more features as described herein.

Figure 18:
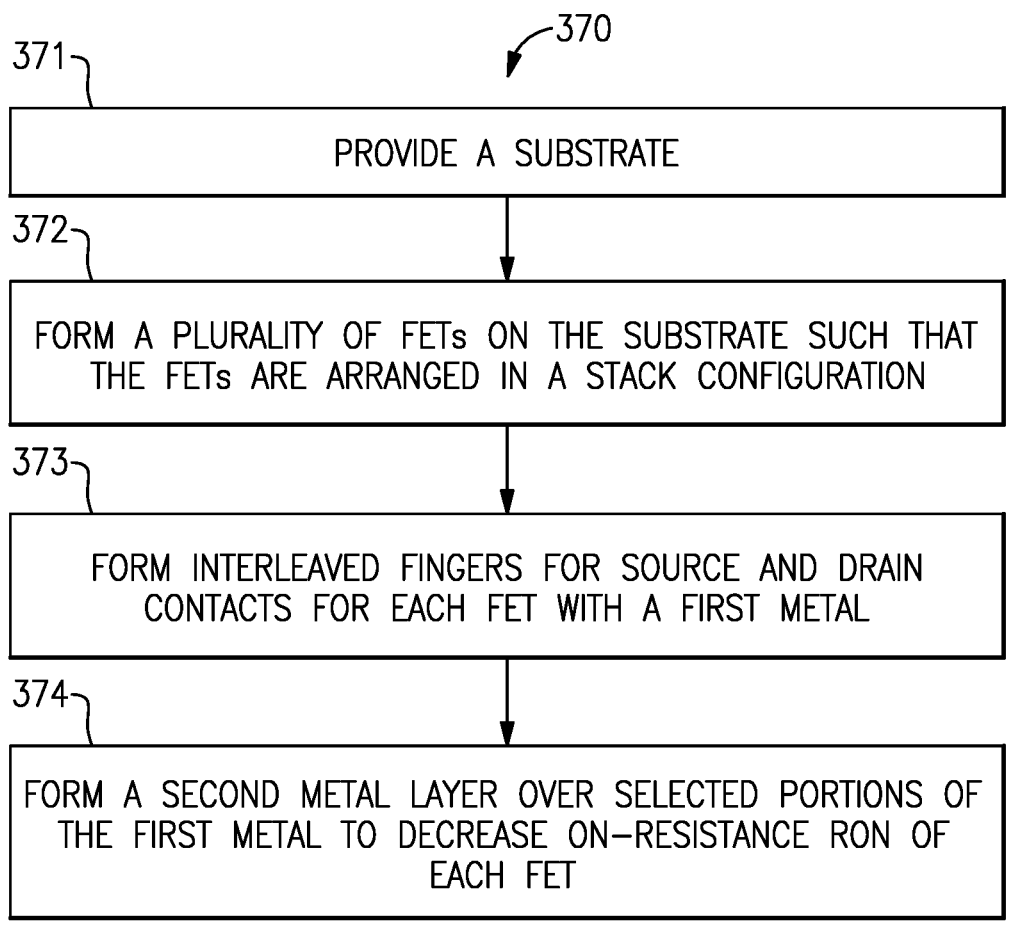
FIG. 18 shows a process that can be implemented to fabricate a FET device having one or more features as described herein.

Examples of Fabrication:

FIG. 18 shows a process 370 that can be implemented to fabricate a FET device such as a FET stack having one or more features as described herein. In block 371, a substrate can be provided. In block 372, a plurality of FETs can be formed on the substrate, such that the FETs are arranged in a stack configuration. In block 373, interleaved fingers for source and drain contacts can be formed with a first metal M1. In block 374, a second metal layer M2 can be formed over selected portions of M1 to decrease ON-resistance (Ron) of each FET.

In some implementations, the process 370 can further include a block where a second metal layer M2 can be formed over source and drain contacts to thereby increase the current carrying capacities of the source and drain contacts. Such increased current carrying capacities may be desirable to accommodate an increase in current carrying capacity of each finger.

Figure 19:
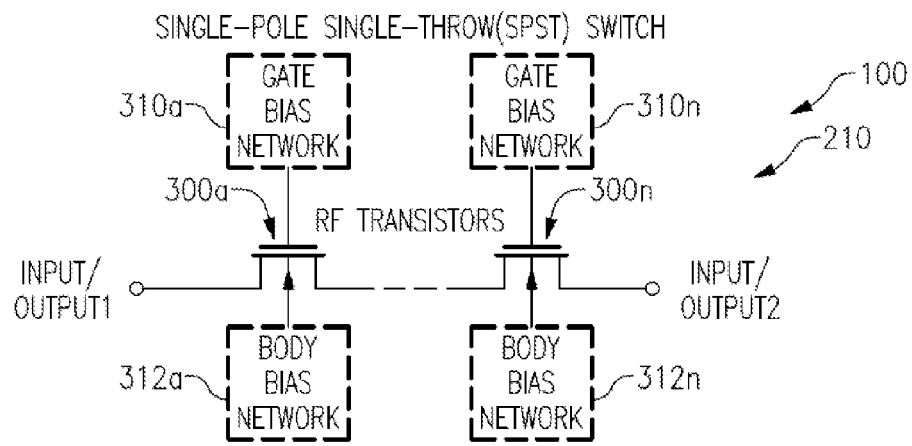
FIG. 19 shows an example of an RF switch having a stack of a plurality of FETs.

Examples of Switching Applications:

In some embodiments, a FET stack having two or more FETs can be implemented as an RF switch. FIG. 19 shows an example of an RF switch having a stack 210 of a plurality of FETs (e.g., N of such FETs 300a to 300n). Such a switch can be configured as a single-pole-single-throw (SPST) switch. Although described in the context of such an example, it will be understood that one or more of stacks 210 can be implemented in other switch configurations.

In the example of FIG. 19, each of the FETs (300a to 300n) can be controlled by its respective gate bias network 310 and body bias network 312. In some implementations, such control operations can be performed in known manners.

Figure 20:
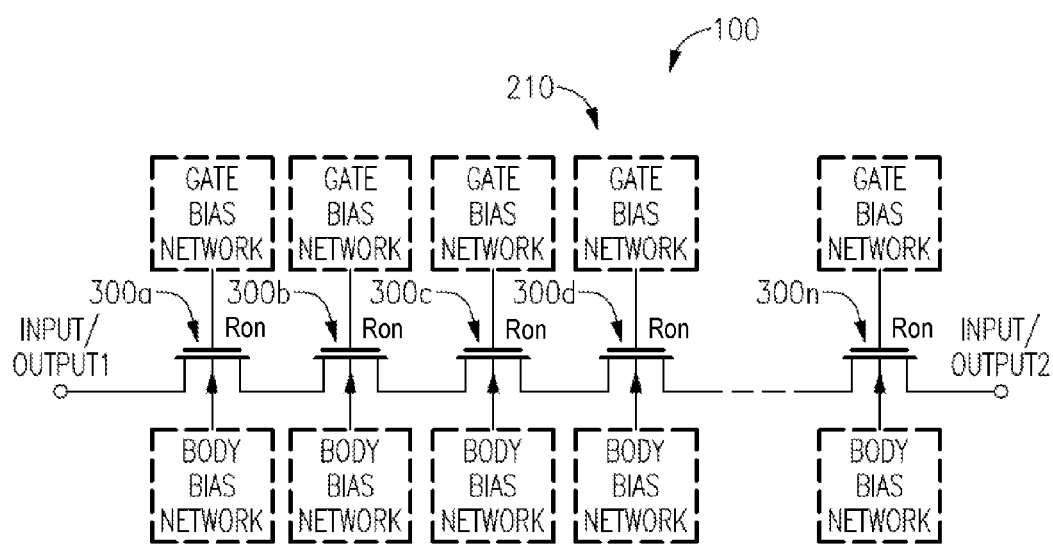
FIG. 20 shows an example RF switch where the FETs can be implemented to include one or more features as described herein.

In some embodiments, an RF switch such as the example of FIG. 19 can include FETs having one or more features described herein. FIG. 20 shows an example RF switch 100 where such features can be implemented as some or all FETs having a reduced Ron due to metal layout(s) as described herein. In the example, an FET stack 210 is shown to include FETs (300a-300n) with such reduced Ron configuration. Such reduced Ron of the FETs can be configured so as to yield a desirable performance improvement for the RF switch 100.

FIGS. 21-26 show non-limiting examples of switching applications where one or more features of the present disclosure can be implemented. FIGS. 27 and 28 show examples where one or more features of the present disclosure can be implemented in SOI devices. FIG. 29-32 show examples of how one or more features of the present disclosure can be implemented in different products.

Figure 21:
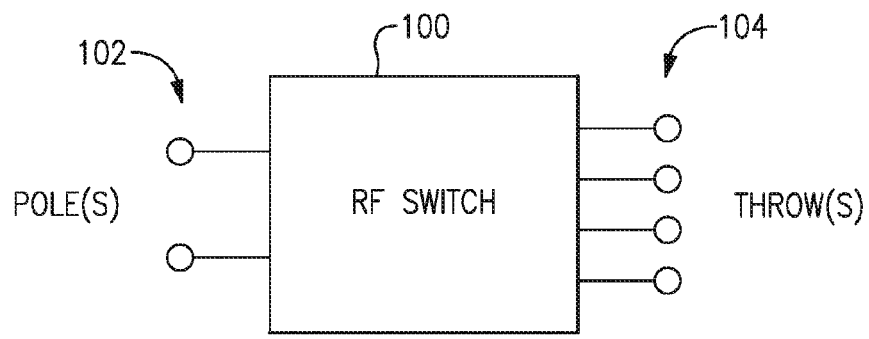
FIG. 21 depicts an RF switch configured to switch one or more signals between one or more poles and one or more throws.

Example Components of a Switching Device:

FIG. 21 schematically shows a radio-frequency (RF) switch 100 configured to switch one or more signals between one or more poles 102 and one or more throws 104. In some embodiments, such a switch can be based on one or more field-effect transistors (FETs) such as silicon-on-insulator (SOI) FETs. When a particular pole is connected to a particular throw, such a path is commonly referred to as being closed or in an ON state. When a given path between a pole and a throw is not connected, such a path is commonly referred to as being open or in an OFF state.

Figure 22:
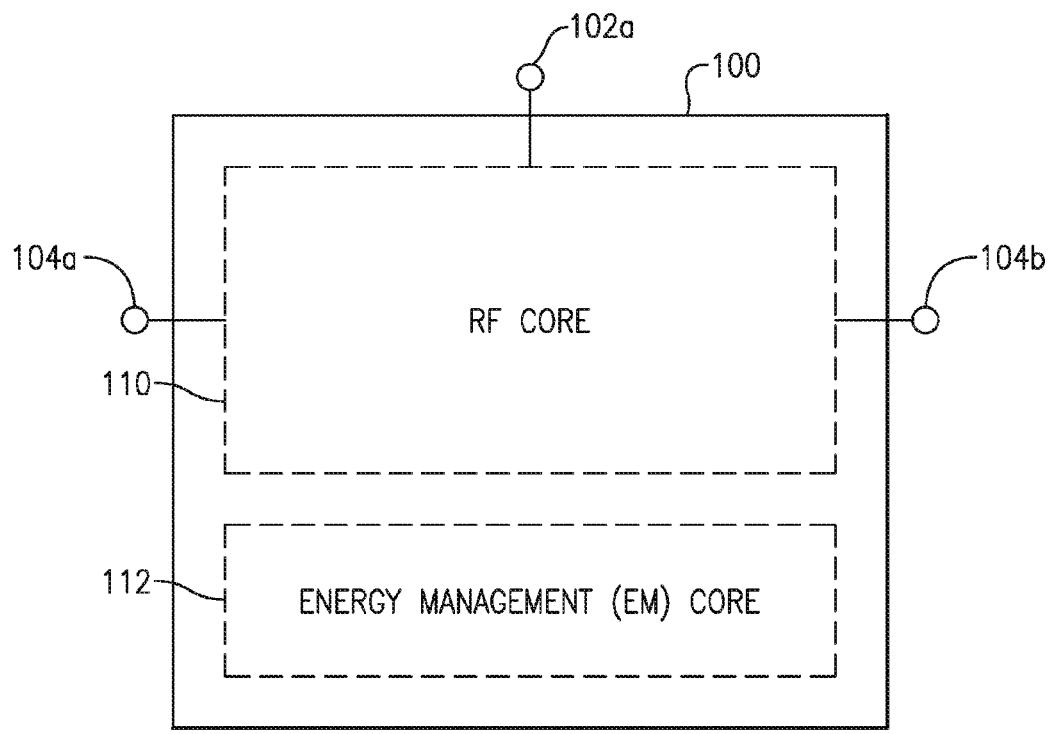
FIG. 22 shows that in some embodiments, the RF switch of FIG. 21 can include an RF core and an energy management (EM) core.

FIG. 22 shows that in some implementations, the RF switch 100 of FIG. 21 can include an RF core 110 and an energy management (EM) core 112. The RF core 110 can be configured to route RF signals between the first and second ports. In the example single-pole-double-throw (SPDT) configuration shown in FIG. 22, such first and second ports can include a pole 102a and a first throw 104a, or the pole 102a and a second throw 104b.

In some embodiments, EM core 112 can be configured to supply, for example, voltage control signals to the RF core. The EM core 112 can be further configured to provide the RF switch 100 with logic decoding and/or power supply conditioning capabilities.

In some embodiments, the RF core 110 can include one or more poles and one or more throws to enable passage of RF signals between one or more inputs and one or more outputs of the switch 100. For example, the RF core 110 can include a single-pole double-throw (SPDT or SP2T) configuration as shown in FIG. 22.

Figure 23:
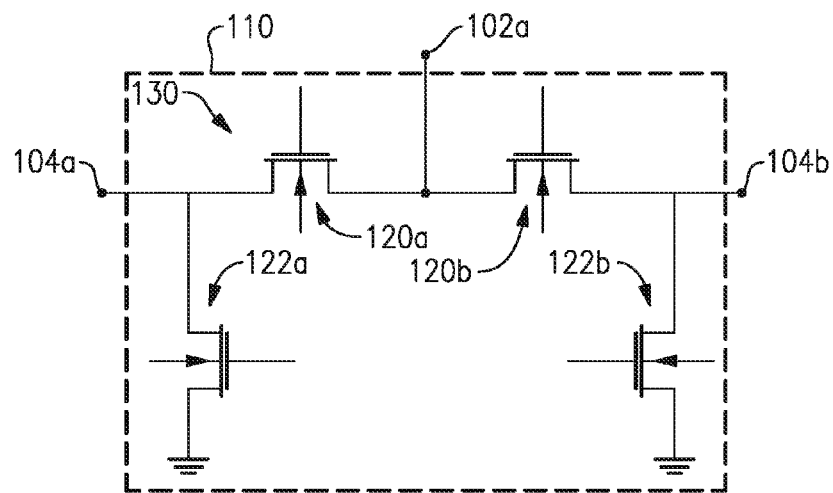
FIG. 23 shows a more detailed example configuration of the RF core of FIG. 22, implemented in an example SPDT (single-pole double-throw) configuration.

In the example SPDT context, FIG. 23 shows a more detailed example configuration of an RF core 110. The RF core 110 is shown to include a single pole 102a coupled to first and second throw nodes 104a, 104b via first and second transistors (e.g., FETs) 120a, 120b. The first throw node 104a is shown to be coupled to an RF ground via an FET 122a to provide shunting capability for the node 104a. Similarly, the second throw node 104b is shown to be coupled to the RF ground via an FET 122b to provide shunting capability for the node 104b.

In an example operation, when the RF core 110 is in a state where an RF signal is being passed between the pole 102a and the first throw 104a, the FET 120a between the pole 102a and the first throw node 104a can be in an ON state, and the FET 120b between the pole 102a and the second throw node 104b can be in an OFF state. For the shunt FETs 122a, 122b, the shunt FET 122a can be in an OFF state so that the RF signal is not shunted to ground as it travels from the pole 102a to the first throw node 104a. The shunt FET 122b associated with the second throw node 104b can be in an ON state so that any RF signals or noise arriving at the RF core 110 through the second throw node 104b is shunted to the ground so as to reduce undesirable interference effects to the pole-to-first-throw operation.

Although the foregoing example is described in the context of a single-pole-double-throw configuration, it will be understood that the RF core can be configured with other numbers of poles and throws. For example, there may be more than one poles, and the number of throws can be less than or greater than the example number of two.

In the example of FIG. 23, the transistors between the pole 102a and the two throw nodes 104a, 104b are depicted as single transistors. In some implementations, such switching functionalities between the pole(s) and the throw(s) can be provided by switch arm segments, where each switch arm segment includes a plurality of transistors such as FETs.

Figure 24:
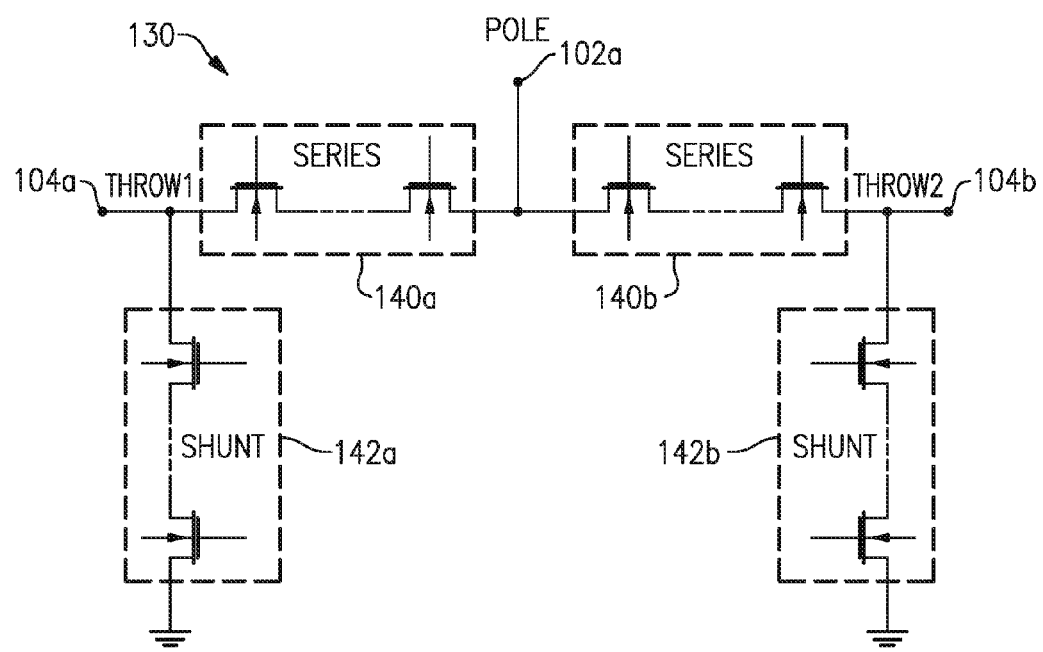
FIG. 24 shows an example where the SPDT configuration of FIG. 23 is implemented with a stack of FETs for each of a series arm and a shunt arm associated with each of the two throws.

An example RF core configuration 130 of an RF core having such switch arm segments is shown in FIG. 24. In the example, the pole 102a and the first throw node 104a are shown to be coupled via a first switch arm segment 140a. Similarly, the pole 102a and the second throw node 104b are shown to be coupled via a second switch arm segment 140b. The first throw node 104a is shown to be capable of being shunted to an RF ground via a first shunt arm segment 142a. Similarly, the second throw node 104b is shown to be capable of being shunted to the RF ground via a second shunt arm segment 142b.

In an example operation, when the RF core 130 is in a state where an RF signal is being passed between the pole 102a and the first throw node 104a, all of the FETs in the first switch arm segment 140a can be in an ON state, and all of the FETs in the second switch arm segment 104b can be in an OFF state. The first shunt arm 142a for the first throw node 104a can have all of its FETs in an OFF state so that the RF signal is not shunted to ground as it travels from the pole 102a to the first throw node 104a. All of the FETs in the second shunt arm 142b associated with the second throw node 104b can be in an ON state so that any RF signals or noise arriving at the RF core 130 through the second throw node 104b is shunted to the ground so as to reduce undesirable interference effects to the pole-to-first-throw operation.

Again, although described in the context of an SP2T configuration, it will be understood that RF cores having other numbers of poles and throws can also be implemented.

In some implementations, a switch arm segment (e.g., 140a, 140b, 142a, 142b) can include one or more semiconductor transistors such as FETs. In some embodiments, an FET may be capable of being in a first state or a second state and can include a gate, a drain, a source, and a body (sometimes also referred to as a substrate). In some embodiments, an FET can include a metal-oxide-semiconductor field effect transistor (MOSFET). In some embodiments, one or more FETs can be connected in series forming a first end and a second end such that an RF signal can be routed between the first end and the second end when the FETs are in a first state (e.g., ON state).

Figure 25:
FIG. 25 shows that FETs having one or more features as described herein can be controlled by a circuit configured to provide bias and/or coupling functionality.

At least some of the present disclosure relates to how a FET or a group of FETs can be controlled to provide switching functionalities in desirable manners. FIG. 25 schematically shows that in some implementations, such controlling of an FET 120 can be facilitated by a circuit 150 configured to bias and/or couple one or more portions of the FET 120. In some embodiments, such a circuit 150 can include one or more circuits configured to bias and/or couple a gate of the FET 120, bias and/or couple a body of the FET 120, and/or couple a source/drain of the FET 120.

Figure 26:
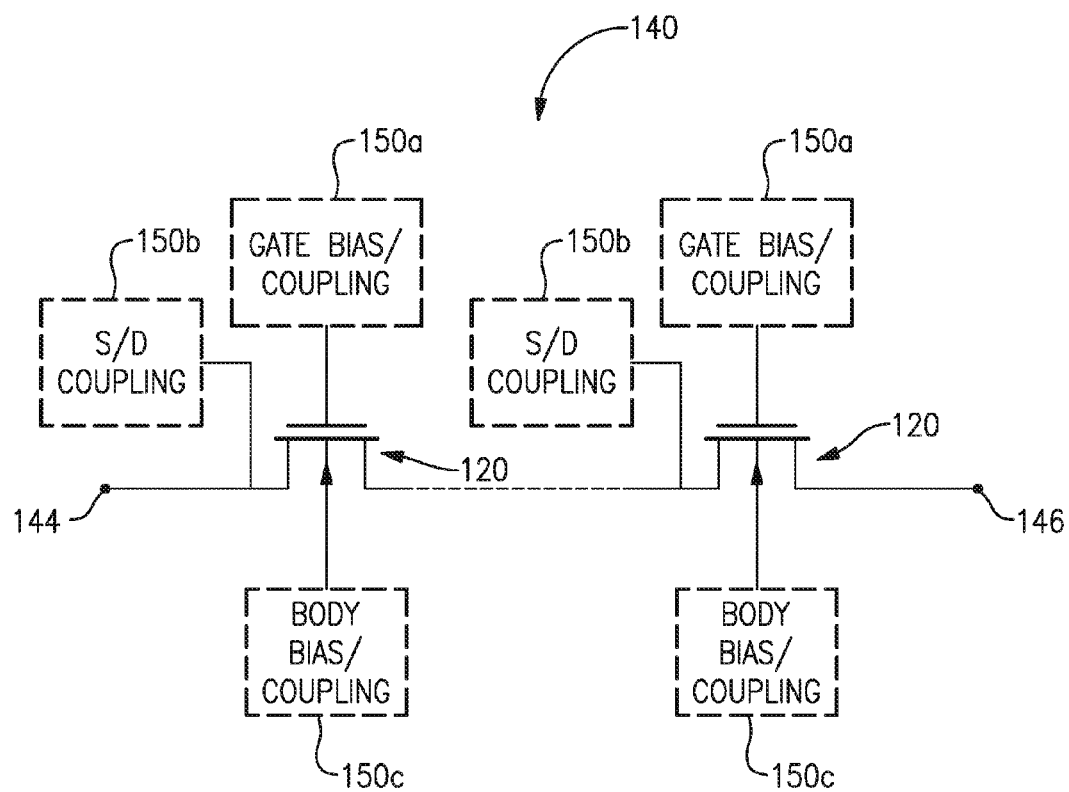
FIG. 26 shows examples of how biasing and/or coupling of different parts of one or more FETs can be implemented.

Schematic examples of how such biasing and/or coupling of different parts of one or more FETs are described in reference to FIG. 26. In FIG. 26, a switch arm segment 140 (that can be, for example, one of the example switch arm segments 140a, 140b, 142a, 142b of the example of FIG. 24) between nodes 144, 146 is shown to include a plurality of FETs 120. Operations of such FETs can be controlled and/or facilitated by a gate bias/coupling circuit 150a, and a body bias/coupling circuit 150c, and/or a source/drain coupling circuit 150b.

Gate Bias/Coupling Circuit

In the example shown in FIG. 26, the gate of each of the FETs 120 can be connected to the gate bias/coupling circuit 150a to receive a gate bias signal and/or couple the gate to another part of the FET 120 or the switch arm 140. In some implementations, designs or features of the gate bias/coupling circuit 150a can improve performance of the switch arm 140. Such improvements in performance can include, but are not limited to, device insertion loss, isolation performance, power handling capability and/or switching device linearity.

Body Bias/Coupling Circuit

As shown in FIG. 26, the body of each FET 120 can be connected to the body bias/coupling circuit 150c to receive a body bias signal and/or couple the body to another part of the FET 120 or the switch arm 140. In some implementations, designs or features of the body bias/coupling circuit 150c can improve performance of the switch arm 140. Such improvements in performance can include, but are not limited to, device insertion loss, isolation performance, power handling capability and/or switching device linearity.

Source/Drain Coupling Circuit

As shown in FIG. 26, the source/drain of each FET 120 can be connected to the coupling circuit 150b to couple the source/drain to another part of the FET 120 or the switch arm 140. In some implementations, designs or features of the coupling circuit 150b can improve performance of the switch arm 140. Such improvements in performance can include, but are not limited to, device insertion loss, isolation performance, power handling capability and/or switching device linearity.

Examples of Switching Performance Parameters:

Insertion Loss

A switching device performance parameter can include a measure of insertion loss. A switching device insertion loss can be a measure of the attenuation of an RF signal that is routed through the RF switching device. For example, the magnitude of an RF signal at an output port of a switching device can be less than the magnitude of the RF signal at an input port of the switching device. In some embodiments, a switching device can include device components that introduce parasitic capacitance, inductance, resistance, or conductance into the device, contributing to increased switching device insertion loss. In some embodiments, a switching device insertion loss can be measured as a ratio of the power or voltage of an RF signal at an input port to the power or voltage of the RF signal at an output port of the switching device. Decreased switching device insertion loss can be desirable to enable improved RF signal transmission.

Isolation

A switching device performance parameter can also include a measure of isolation. Switching device isolation can be a measure of the RF isolation between an input port and an output port an RF switching device. In some embodiments, it can be a measure of the RF isolation of a switching device while the switching device is in a state where an input port and an output port are electrically isolated, for example while the switching device is in an OFF state. Increased switching device isolation can improve RF signal integrity. In certain embodiments, an increase in isolation can improve wireless communication device performance.

Intermodulation Distortion

A switching device performance parameter can further include a measure of intermodulation distortion (IMD) performance. Intermodulation distortion (IMD) can be a measure of non-linearity in an RF switching device.

IMD can result from two or more signals mixing together and yielding frequencies that are not harmonic frequencies. For example, suppose that two signals have fundamental frequencies $f_1$ and $f_2$ ($f_2 > f_1$) that are relatively close to each other in frequency space. Mixing of such signals can result in peaks in frequency spectrum at frequencies corresponding to different products of fundamental and harmonic frequencies of the two signals. For example, a second-order intermodulation distortion (also referred to as IMD2) is typically considered to include frequencies $f_1 + f_2$, $f_2 - f_1$, $2f_1$, and $2f_2$. A third-order IMD (also referred to as IMD3) is typically considered to include $2f_1 + f_2$, $2f_1 - f_2$, $f_1 + 2f_2$, $f_1 - 2f_2$. Higher order products can be formed in similar manners.

In general, as the IMD order number increases, power levels decrease. Accordingly, second and third orders can be undesirable effects that are of particular interest. Higher orders such as fourth and fifth orders can also be of interest in some situations.

In some RF applications, it can be desirable to reduce susceptibility to interference within an RF system. Non linearity in RF systems can result in introduction of spurious signals into the system. Spurious signals in the RF system can result in interference within the system and degrade the information transmitted by RF signals. An RF system having increased non-linearity can demonstrate increased susceptibility to interference. Non-linearity in system components, for example switching devices, can contribute to the introduction of spurious signals into the RF system, thereby contributing to degradation of overall RF system linearity and IMD performance.

In some embodiments, RF switching devices can be implemented as part of an RF system including a wireless communication system. IMD performance of the system can be improved by increasing linearity of system components, such as linearity of an RF switching device. In some embodiments, a wireless communication system can operate in a multi-band and/or multi-mode environment. Improvement in intermodulation distortion (IMD) performance can be desirable in wireless communication systems operating in a multi-band and/or multi-mode environment. In some embodiments, improvement of a switching device IMD performance can improve the IMD performance of a wireless communication system operating in a multi-mode and/or multi-band environment.

Improved switching device IMD performance can be desirable for wireless communication devices operating in various wireless communication standards, for example for wireless communication devices operating in the LTE communication standard. In some RF applications, it can be desirable to improve linearity of switching devices operating in wireless communication devices that enable simultaneous transmission of data and voice communication. For example, improved IMD performance in switching devices can be desirable for wireless communication devices operating in the LTE communication standard and performing simultaneous transmission of voice and data communication (e.g., SVLTE).

High Power Handling Capability

In some RF applications, it can be desirable for RF switching devices to operate under high power while reducing degradation of other device performance parameters. In some embodiments, it can be desirable for RF switching devices to operate under high power with improved intermodulation distortion, insertion loss, and/or isolation performance.

In some embodiments, an increased number of transistors can be implemented in a switch arm segment of a switching device to enable improved power handling capability of the switching device. For example, a switch arm segment can include an increased number of FETs connected in series, an increased FET stack height, to enable improved device performance under high power. However, in some embodiments, increased FET stack height can degrade the switching device insertion loss performance.

Examples of FET Structures and Fabrication Process Technologies:

A switching device can be implemented on-die, off-die, or some combination thereon. A switching device can also be fabricated using various technologies. In some embodiments, RF switching devices can be fabricated with silicon or silicon-on-insulator (SOI) technology.

As described herein, an RF switching device can be implemented using silicon-on-insulator (SOI) technology. In some embodiments, SOI technology can include a semiconductor substrate having an embedded layer of electrically insulating material, such as a buried oxide layer beneath a silicon device layer. For example, an SOI substrate can include an oxide layer embedded below a silicon layer. Other insulating materials known in the art can also be used.

Implementation of RF applications, such as an RF switching device, using SOI technology can improve switching device performance. In some embodiments, SOI technology can enable reduced power consumption. Reduced power consumption can be desirable in RF applications, including those associated with wireless communication devices. SOI technology can enable reduced power consumption of device circuitry due to decreased parasitic capacitance of transistors and interconnect metallization to a silicon substrate. Presence of a buried oxide layer can also reduce junction capacitance or use of high resistivity substrate, enabling reduced substrate related RF losses. Electrically isolated SOI transistors can facilitate stacking, contributing to decreased chip size.

Figure 27A:
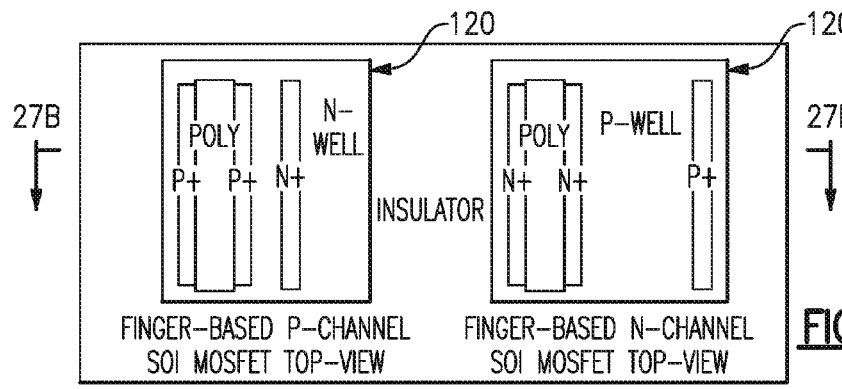
FIGS. 27A and 27B show plan and side sectional views of an example finger-based FET device implemented on silicon-on-insulator (SOI).
Figure 27B:
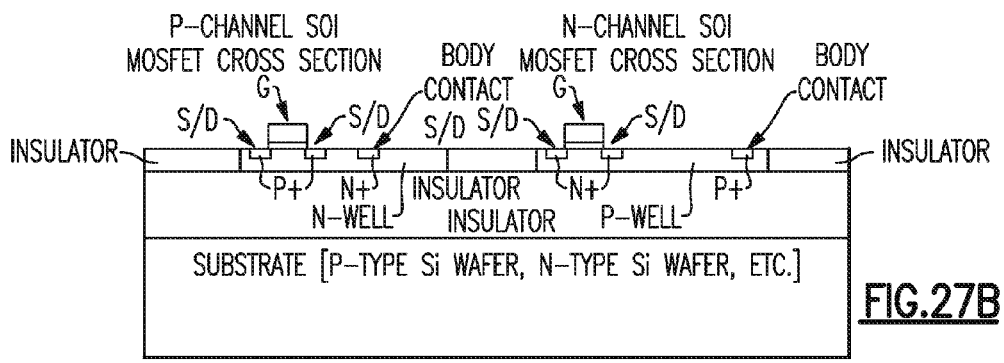

In some SOI FET configurations, each transistor can be configured as a finger-based device where the source and drain are rectangular shaped (in a plan view) and a gate structure extends between the source and drain like a rectangular shaped finger. FIGS. 27A and 27B show plan and side sectional views of an example finger-based FET device implemented on SOI. As shown, FET devices described herein can include a p-type FET or an n-type FET. Thus, although some FET devices are described herein as p-type devices, it will be understood that various concepts associated with such p-type devices can also apply to n-type devices.

As shown in FIGS. 27A and 27B, a pMOSFET can include an insulator layer formed on a semiconductor substrate. The insulator layer can be formed from materials such as silicon dioxide or sapphire. An n-well is shown to be formed in the insulator such that the exposed surface generally defines a rectangular region. Source (S) and drain (D) are shown to be p-doped regions whose exposed surfaces generally define rectangles. As shown, S/D regions can be configured so that source and drain functionalities are reversed.

FIGS. 27A and 27B further show that a gate (G) can be formed on the n-well so as to be positioned between the source and the drain. The example gate is depicted as having a rectangular shape that extends along with the source and the drain. Also shown is an n-type body contact. Formations of the rectangular shaped well, source and drain regions, and the body contact can be achieved by a number of known techniques.

Figure 28A:
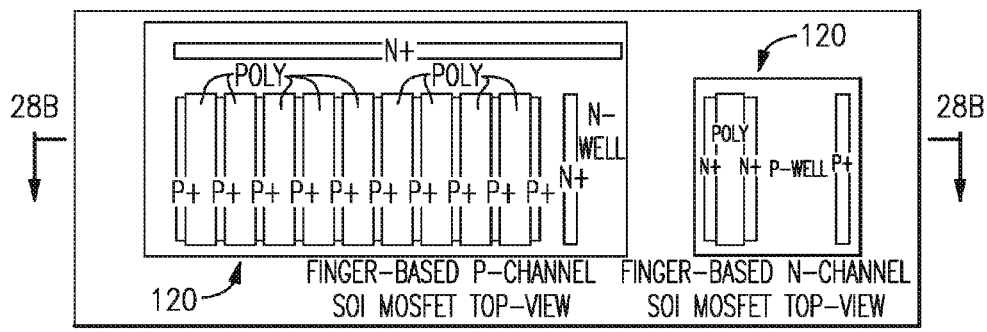
FIGS. 28A and 28B show plan and side sectional views of an example multiple-finger FET device implemented on SOI.
Figure 28B:
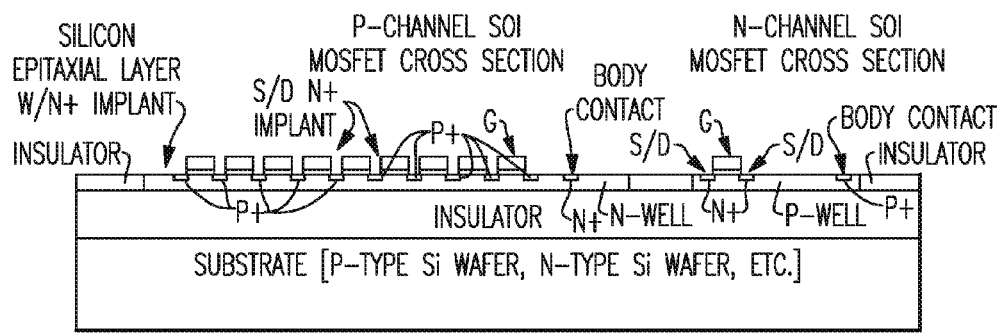

FIGS. 28A and 28B show plan and side sectional views of an example of a multiple-finger FET device implemented on SOI. Formations of rectangular shaped n-well, rectangular shaped p-doped regions, rectangular shaped gates, and n-type body contact can be achieved in manners similar to those described in reference to FIGS. 27A and 27B.

The example multiple-finger FET device of FIGS. 28A and 28B can be configured so that the source regions are electrically connected together to a source node, and the drain regions are connected together to a drain node. The gates can also be connected together to a gate node. In such an example configuration, a common gate bias signal can be provided through the gate node to control flow of current between the source node and the drain node.

In some implementations, a plurality of the foregoing multi-finger FET devices can be connected in series as a switch to allow handling of high power RF signals. Each FET device can divide the overall voltage drop associated with power dissipation at the connected FETs. A number of such multi-finger FET devices can be selected based on, for example, power handling requirement of the switch.

Examples of Implementations in Products:

Various examples of FET-based switch circuits described herein can be implemented in a number of different ways and at different product levels. Some of such product implementations are described by way of examples.

Semiconductor Die Implementation

Figure 29A:
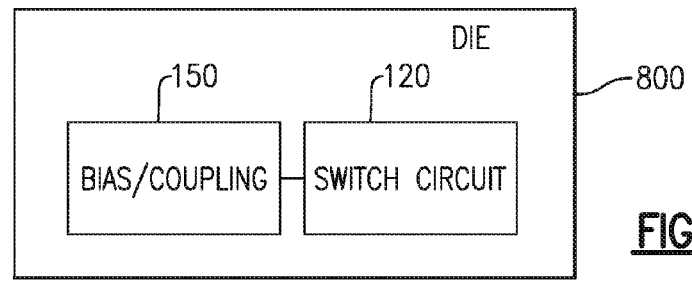
FIGS. 29A-29D show non-limiting examples of how one or more features of the present disclosure can be implemented on one or more semiconductor die.
Figure 29B:
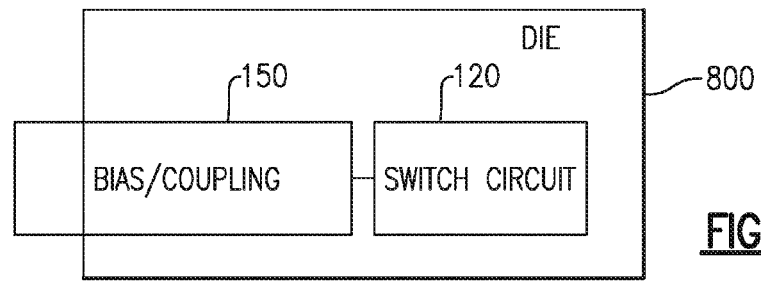

FIGS. 29A-29D schematically show non-limiting examples of such implementations on one or more semiconductor die. FIG. 29A shows that in some embodiments, a switch circuit 120 and a bias/coupling circuit 150 having one or more features as described herein can be implemented on a die 800. FIG. 29B shows that in some embodiments, at least some of the bias/coupling circuit 150 can be implemented outside of the die 800 of FIG. 29A.

Figure 29C:
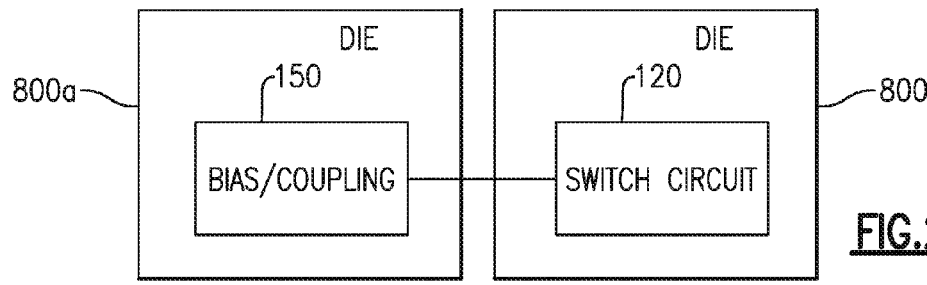
Figure 29D:
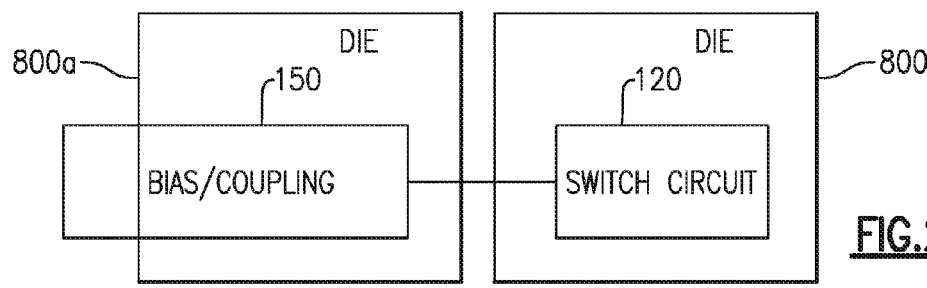

FIG. 29C shows that in some embodiments, a switch circuit 120 having one or more features as described herein can be implemented on a first die 800a, and a bias/coupling circuit 150 having one or more features as described herein can be implemented on a second die 800b. FIG. 29D shows that in some embodiments, at least some of the bias/coupling circuit 150 can be implemented outside of the first die 800a of FIG. 29C.

Packaged Module Implementation

Figure 30A:
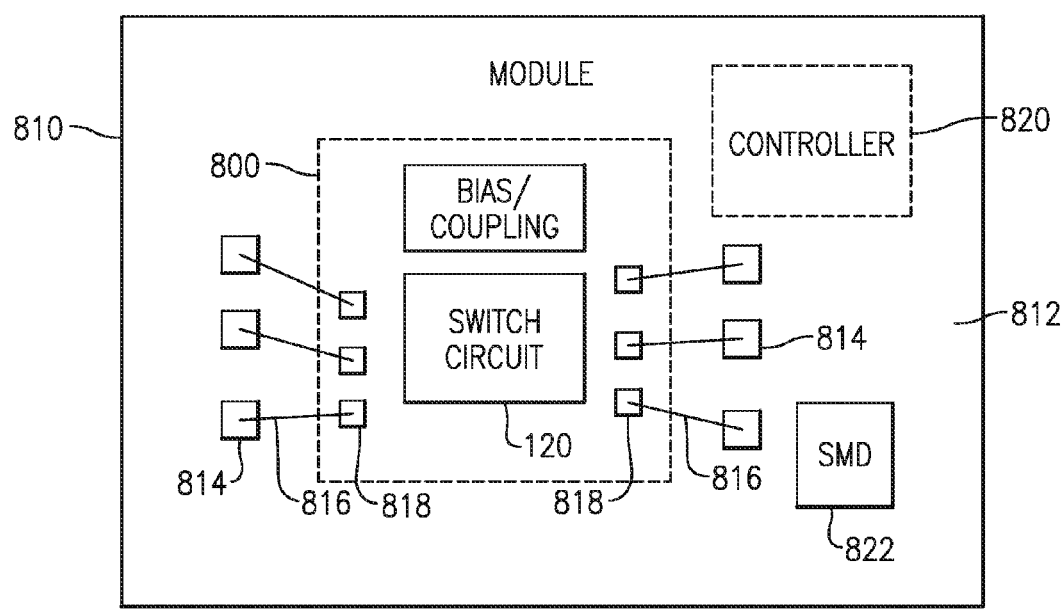
FIGS. 30A and 30B show that one or more die having one or more features described herein can be implemented in a packaged module.

In some embodiments, one or more die having one or more features described herein can be implemented in a packaged module. An example of such a module is shown in FIGS. 30A (plan view) and 30B (side view). Although described in the context of both of the switch circuit and the bias/coupling circuit being on the same die (e.g., example configuration of FIG. 29A), it will be understood that packaged modules can be based on other configurations.

A module 810 is shown to include a packaging substrate 812. Such a packaging substrate can be configured to receive a plurality of components, and can include, for example, a laminate substrate. The components mounted on the packaging substrate 812 can include one or more dies. In the example shown, a die 800 having a switching circuit 120 and a bias/coupling circuit 150 is shown to be mounted on the packaging substrate 812. The die 800 can be electrically connected to other parts of the module (and with each other where more than one die is utilized) through connections such as connection-wirebonds 816. Such connection-wirebonds can be formed between contact pads 818 formed on the die 800 and contact pads 814 formed on the packaging substrate 812. In some embodiments, one or more surface mounted devices (SMDs) 822 can be mounted on the packaging substrate 812 to facilitate various functionalities of the module 810.

In some embodiments, the packaging substrate 812 can include electrical connection paths for interconnecting the various components with each other and/or with contact pads for external connections. For example, a connection path 832 is depicted as interconnecting the example SMD 822 and the die 800. In another example, a connection path 832 is depicted as interconnecting the SMD 822 with an external-connection contact pad 834. In yet another example a connection path 832 is depicted as interconnecting the die 800 with ground-connection contact pads 836.

In some embodiments, a space above the packaging substrate 812 and the various components mounted thereon can be filled with an overmold structure 830. Such an overmold structure can provide a number of desirable functionalities, including protection for the components and wirebonds from external elements, and easier handling of the packaged module 810.

Figure 30B:
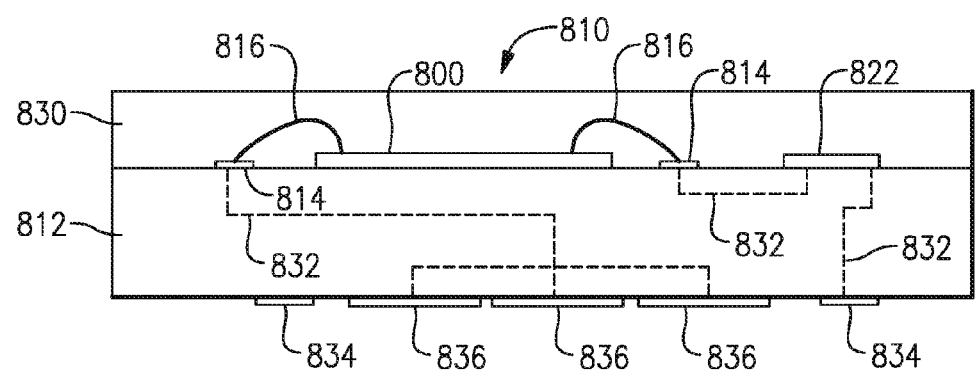
Figure 31:
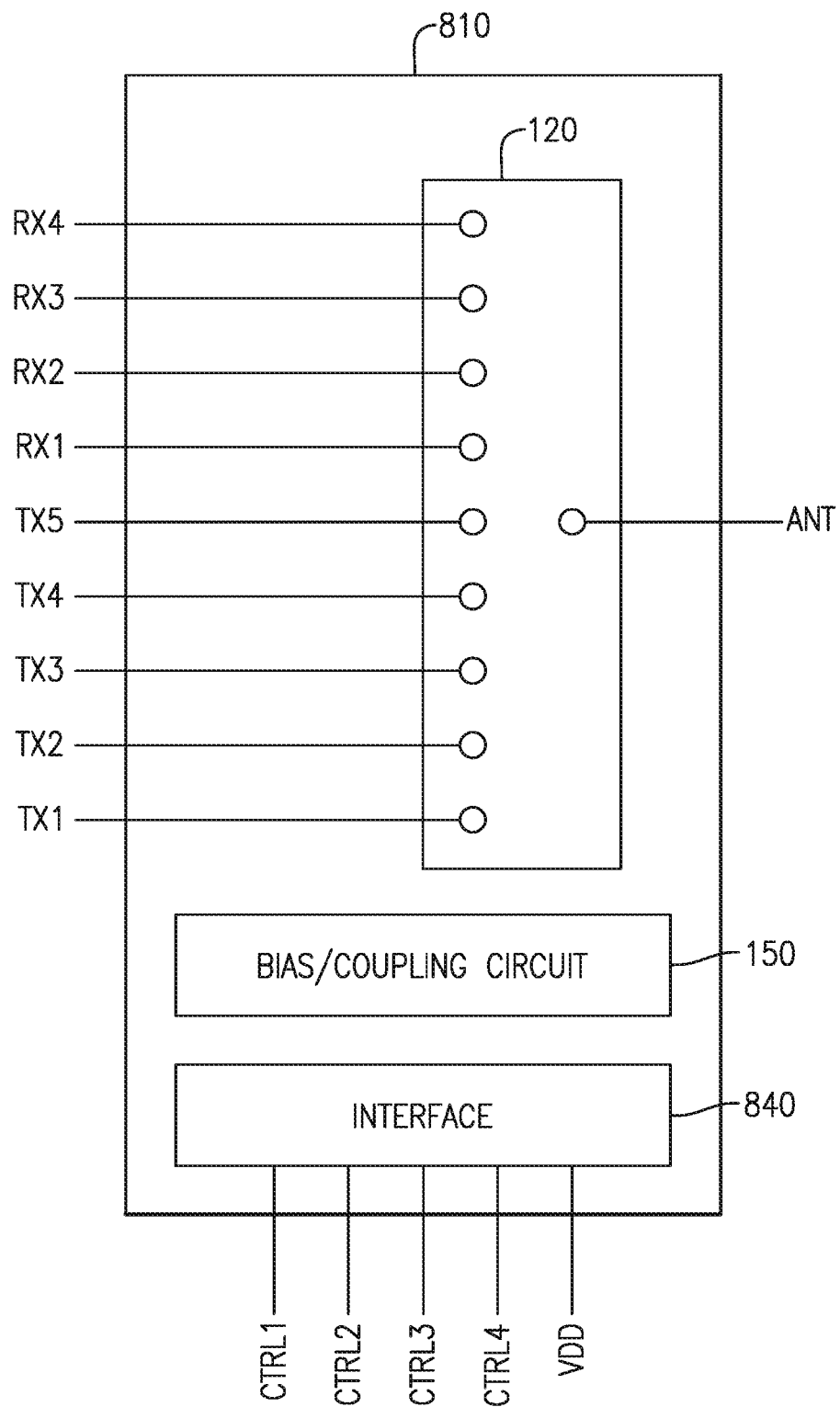
FIG. 31 shows a schematic diagram of an example switching configuration that can be implemented in a module such as the example of FIGS. 30A and 30B.

FIG. 31 shows a schematic diagram of an example switching configuration that can be implemented in the module 810 described in reference to FIGS. 30A and 30B. In the example, the switch circuit 120 is depicted as being an SP9T switch, with the pole being connectable to an antenna and the throws being connectable to various Rx and Tx paths. Such a configuration can facilitate, for example, multi-mode multi-band operations in wireless devices.

The module 810 can further include an interface for receiving power (e.g., supply voltage VDD) and control signals to facilitate operation of the switch circuit 120 and/or the bias/coupling circuit 150. In some implementations, supply voltage and control signals can be applied to the switch circuit 120 via the bias/coupling circuit 150.

Wireless Device Implementation

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 32:
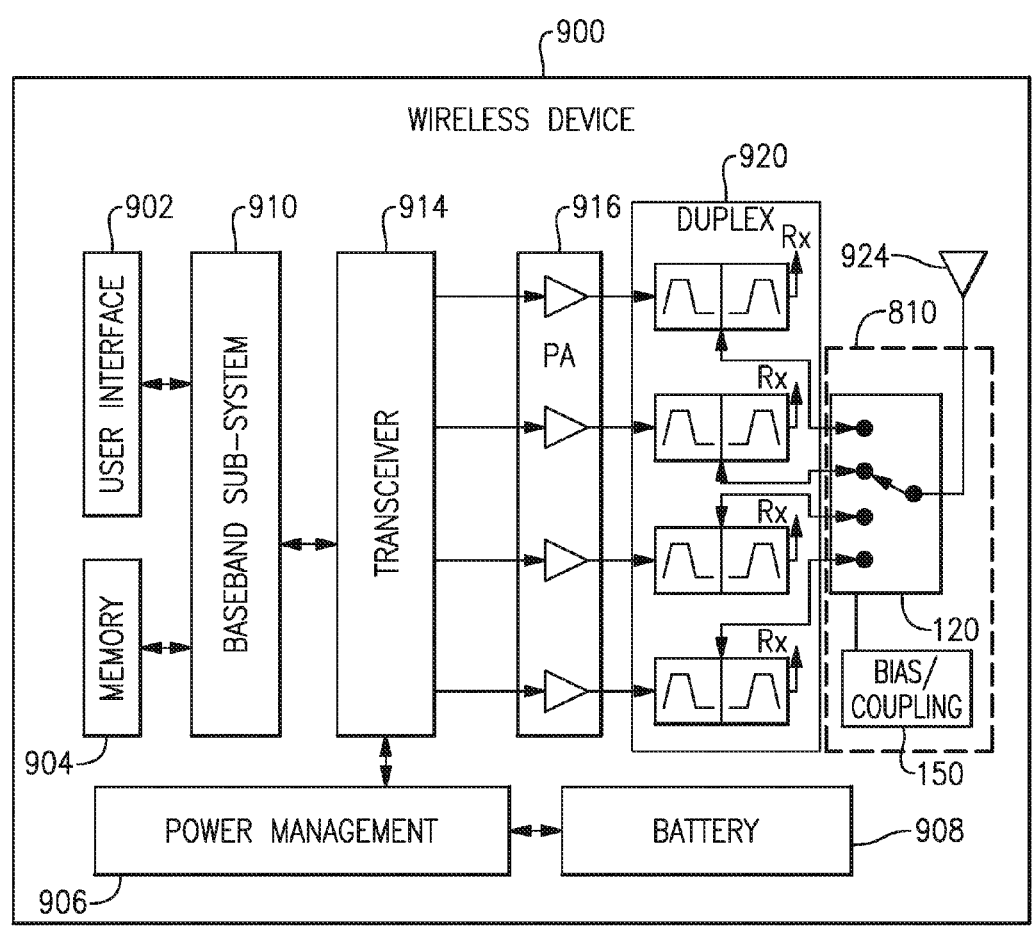
FIG. 32 depicts an example wireless device having one or more advantageous features described herein.

FIG. 32 schematically depicts an example wireless device 900 having one or more advantageous features described herein. In the context of various switches and various biasing/coupling configurations as described herein, a switch 120 and a bias/coupling circuit 150 can be part of a module 810. In some embodiments, such a switch module can facilitate, for example, multi-band multi-mode operation of the wireless device 900.

In the example wireless device 900, a power amplifier (PA) module 916 having a plurality of PAs can provide an amplified RF signal to the switch 120 (via a duplexer 920), and the switch 120 can route the amplified RF signal to an antenna. The PA module 916 can receive an unamplified RF signal from a transceiver 914 that can be configured and operated in known manners. The transceiver can also be configured to process received signals. The transceiver 914 is shown to interact with a baseband sub-system 910 that is configured to provide conversion between data and/or voice signals suitable for a user and RF signals suitable for the transceiver 914. The transceiver 914 is also shown to be connected to a power management component 906 that is configured to manage power for the operation of the wireless device 900. Such a power management component can also control operations of the baseband sub-system 910 and the module 810.

The baseband sub-system 910 is shown to be connected to a user interface 902 to facilitate various input and output of voice and/or data provided to and received from the user. The baseband sub-system 910 can also be connected to a memory 904 that is configured to store data and/or instructions to facilitate the operation of the wireless device, and/or to provide storage of information for the user.

In some embodiments, the duplexer 920 can allow transmit and receive operations to be performed simultaneously using a common antenna (e.g., 924). In FIG. 32, received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A field-effect transistor (FET) device comprising:
a source contact and a drain contact;
a first group of fingers electrically connected to the source contact; and
a second group of fingers electrically connected to the drain contact and arranged in an interleaved configuration with respect to the first group of fingers, at least some of the first group of fingers and the second group of fingers including a first metal M1 and a second metal M2 arranged in a stack, at least one of the first metal M1 and the second metal M2 including a tapered portion to yield a current carrying capacity that varies as a function of location along a direction in which the corresponding finger extends, the second metal M2 further including a portion implemented over and having a width greater than a respective source contact or drain contact.

2. The FET device of claim 1 wherein the current carrying capacity is higher at a proximal end of a given finger than at a distal end of the finger, the proximal end being adjacent to a respective source or drain contact.

3. The FET device of claim 2 wherein the current carrying capacity decreases in one or more steps along the length of the finger from the proximal end to the distal end.

4. The FET device of claim 2 wherein the current carrying capacity varies continuously for a portion of the length of the finger.

5. The FET device of claim 2 wherein the first metal M1 extends substantially the entire length of the finger.

6. The FET device of claim 5 wherein the second metal M2 is configured such that the higher current carrying capacity at the proximal end of the given finger is achieved without an increase in a dimension of the first metal M1.

7. The FET device of claim 5 wherein the first metal M1 has a tapered profile such that the proximal end has a wider dimension than the distal end.

8. The FET device of claim 7 wherein the second metal M2 has a substantially constant width that is less than or equal to the width of the first metal M1.

9. The FET device of claim 7 wherein the second metal M2 has a tapered profile between its proximal and distal ends.

10. The FET device of claim 7 wherein the second metal M2 has a tapered portion between its proximal end and an intermediate location, and a straight portion between the intermediate location and its distal end.

11. The FET device of claim 5 wherein the first metal M1 has a substantially constant width between its proximal and distal ends.

12. The FET device of claim 11 wherein the second metal M2 has a tapered profile between its proximal and distal ends.

13. The FET device of claim 11 wherein the second metal M2 has a tapered portion between its proximal end and an intermediate location, and a straight portion between the intermediate location and its distal end.

14. The FET device of claim 5 wherein the second metal M2 is separated from the first metal M1 by an electrically insulating layer, with the second metal M2 being electrically connected with the first metal M1 by one or more conductive vias.

15. The FET device of claim 14 wherein the second metal M2 is positioned above the first metal M1.

16. The FET device of claim 14 wherein at least one of the first metal M1 and the second metal M2 is configured such that an off-state capacitance of the finger is approximately the same as an off-state capacitance associated with a finger having only the first metal M1.

17. The FET device of claim 1 wherein the FET is a silicon-on-insulator (SOI) device.

18. A radio-frequency (RF) switching device comprising:
a first terminal and a second terminal; and
a plurality of field-effect transistors (FETs) arranged in series to form a stack, one end of the stack electrically connected to the first terminal and the other end of the stack electrically connected to the second terminal, each of at least some of the FETs including a source contact and a drain contact, a first group of fingers electrically connected to the source contact, and a second group of fingers electrically connected to the drain contact and arranged in an interleaved configuration with respect to the first group of fingers, at least some of the first group of fingers and the second group of fingers including a first metal M1 and a second metal M2 arranged in a stack, at least one of the first metal M1 and the second metal M2 including a tapered portion to yield a current carrying capacity that varies as a function of location along a direction in which the corresponding finger extends, the second metal M2 further including a portion implemented over and having a width greater than a respective source contact or drain contact.

19. The RF switching device of claim 18 wherein the FETs are implemented as a silicon-on-insulator (SOI) device.

20. A radio-frequency (RF) switching module comprising:
a packaging substrate configured to receive a plurality of components; and
a die mounted on the packaging substrate, the die having a switching circuit including a plurality of field-effect transistors (FETs) connected in series to form a stack, one end of the stack electrically connected to a first terminal of the switching circuit and the other end of the stack electrically connected to a second terminal of the switching circuit, each of at least some of the FETs including a source contact and a drain contact, a first group of fingers electrically connected to the source contact, and a second group of fingers electrically connected to the drain contact and arranged in an interleaved configuration with respect to the first group of fingers, at least some of the first group of fingers and the second group of fingers including a first metal M1 and a second metal M2 arranged in a stack, at least one of the first metal M1 and the second metal M2 including a tapered portion to yield a current carrying capacity that varies as a function of location along a direction in which the corresponding finger extends, the second metal M2 further including a portion implemented over and having a width greater than a respective source contact or drain contact.

* * * * *